United States Patent
Katsuta et al.

(10) Patent No.: US 9,715,308 B2
(45) Date of Patent: Jul. 25, 2017

(54) DISPLAY APPARATUS

(71) Applicant: Japan Display Inc., Minato-ku (JP)

(72) Inventors: Tadayoshi Katsuta, Minato-ku (JP); Gen Koide, Minato-ku (JP)

(73) Assignee: JAPAN DISPLAY INC., Minato-ku (JP)

( * ) Notice: Subject to any disclaimer, the term of this patent is extended or adjusted under 35 U.S.C. 154(b) by 0 days.

(21) Appl. No.: 15/340,071

(22) Filed: Nov. 1, 2016

(65) Prior Publication Data

US 2017/0046001 A1  Feb. 16, 2017

Related U.S. Application Data

(63) Continuation of application No. 14/995,752, filed on Jan. 14, 2016, now Pat. No. 9,508,754.

(30) Foreign Application Priority Data

Jan. 30, 2015  (JP) ................. 2015-017940

(51) Int. Cl.
*H01L 27/14* (2006.01)
*G06F 3/041* (2006.01)
(Continued)

(52) U.S. Cl.
CPC ........ *G06F 3/0416* (2013.01); *G02F 1/13338* (2013.01); *G02F 1/13452* (2013.01);
(Continued)

(58) Field of Classification Search
CPC ........ G06F 3/0416; G06F 3/0412; G06F 3/04; G02F 1/13338; G02F 1/134309; G02F 1/13452; G02F 1/133514; G02F 1/133528; G02F 1/1368; G02F 2001/136222; G02F 2201/123; H01L 27/0296; H01L 27/1222; H01L 27/124; H01L 29/78666; H01L 29/78675; G09G 2300/0439;
(Continued)

(56) References Cited

U.S. PATENT DOCUMENTS 9,135,873 B2  9/2015  Miyatake et al.
9,274,653 B2  3/2016  Ishizaki et al.
(Continued)

FOREIGN PATENT DOCUMENTS

JP  2014-199605  10/2014

*Primary Examiner* — Yosef Gebreyesus
(74) *Attorney, Agent, or Firm* — Oblon, McClelland, Naier & Neustadt, L.L.P.

(57) ABSTRACT

An area of a region arranged on one side out of a display region in a direction in which scanning signal lines extend is reduced. A display apparatus includes: a partial circuit; a plurality of scanning signal lines; and a plurality of scanning signal connection wirings for connecting the partial circuit and each of the plurality of scanning signal lines. Each of the plurality of scanning signal lines extends in an X-axis direction, and is arranged with a pitch in a Y-axis direction. A plurality of ends respectively included in the plurality of scanning signal connection wirings are connected to the partial circuit, and are arranged in the Y-axis direction. A distance in the Y-axis direction between the respective centers of the two ends adjacent to each other is narrower than the pitch.

7 Claims, 15 Drawing Sheets

(51) Int. Cl.
*H01L 27/12* (2006.01)
*H01L 27/02* (2006.01)
*G06F 3/044* (2006.01)
*G09G 3/36* (2006.01)
*G02F 1/1333* (2006.01)
*G02F 1/1343* (2006.01)
*G02F 1/1345* (2006.01)
*G02F 1/1362* (2006.01)
*H01L 29/786* (2006.01)
*G02F 1/1335* (2006.01)
*G02F 1/1368* (2006.01)

(52) U.S. Cl.
CPC .. *G02F 1/134309* (2013.01); *G02F 1/136286* (2013.01); *G06F 3/044* (2013.01); *G06F 3/0412* (2013.01); *G09G 3/3611* (2013.01); *G09G 3/3674* (2013.01); *G09G 3/3696* (2013.01); *H01L 27/0296* (2013.01); *H01L 27/124* (2013.01); *H01L 27/1222* (2013.01); *H01L 29/78666* (2013.01); *H01L 29/78675* (2013.01); *G02F 1/1368* (2013.01); *G02F 1/133514* (2013.01); *G02F 1/133528* (2013.01); *G02F 2001/136222* (2013.01); *G02F 2201/123* (2013.01); *G06F 2203/04102* (2013.01); *G09G 2300/0426* (2013.01); *G09G 2300/0439* (2013.01); *G09G 2300/08* (2013.01); *G09G 2300/0876* (2013.01); *G09G 2310/0281* (2013.01); *G09G 2310/0291* (2013.01); *G09G 2330/04* (2013.01)

(58) Field of Classification Search
CPC ....... G09G 2300/0426; G09G 2300/08; G09G 2300/0876; G09G 2310/0281; G09G 2310/0291
See application file for complete search history.

(56) References Cited

U.S. PATENT DOCUMENTS

| | | | |
|---|---|---|---|
| 2010/0182273 A1* | 7/2010 | Noguchi | G02F 1/13338 345/174 |
| 2012/0075239 A1* | 3/2012 | Azumi | G06F 3/044 345/174 |
| 2013/0257698 A1 | 10/2013 | Toya et al. | |
| 2014/0152613 A1* | 6/2014 | Ishizaki | G06F 3/0412 345/174 |
| 2014/0204303 A1 | 7/2014 | Koide | |
| 2015/0029081 A1 | 1/2015 | Kawachi et al. | |

* cited by examiner

DISPLAY APPARATUS

CROSS-REFERENCE TO RELATED APPLICATION

The present application is a continuation of U.S. application Ser. No. 14/995,752, filed Jan. 14, 2016 which claims priority from Japanese Patent Application No. 2015-17940 filed on Jan. 30, 2015, the contents of both which are hereby incorporated by reference into this application.

TECHNICAL FIELD OF THE INVENTION

The present invention relates to a display apparatus. For example, the present invention relates to a technique effectively applied to a display apparatus having a scanning signal line for feeding a scanning signal to a plurality of pixels provided in a display region.

BACKGROUND OF THE INVENTION

There is a display apparatus that displays an image by feeding a scanning signal to a plurality of pixels provided in a display region via a plurality of scanning signal lines and feeding a video signal thereto via a plurality of video signal lines. In such a display apparatus, it is required to reduce an area of a region in periphery of the display region for downsizing the display apparatus and expanding the display region.

In the above-described display apparatus, gate drivers are provided in the regions in periphery of the display region so as to sandwich the display region provided with pixels therebetween. The gate driver is provided in a region arranged on one side out of the display region in a direction in which the scanning signal lines extend.

For example, Japanese Patent Application Laid-Open Publication No. 2014-199605 (Patent Document 1) describes a technique in which a display apparatus has two gate drivers arranged so as to sandwich a display region having a large number of pixels in a matrix form therebetween.

SUMMARY OF THE INVENTION

In the above-described display apparatus, the gate driver includes a plurality of transfer circuits. Each of the plurality of transfer circuits is formed of, for example, a shift register, and is arranged in a direction intersecting a direction in which the scanning signal lines extend in a region arranged on one side out of the display region in the direction in which the scanning signal lines extend. Each of the plurality of transfer circuits is connected to, for example, the plurality of scanning signal lines. Therefore, the transfer circuits are arranged with a pitch that is an integral multiple of a pixel pitch.

On the other hand, in the above-described display apparatus, a circuit different from the transfer circuit included in the gate driver, such as a driving circuit included in a driving electrode driver in a case of, for example, a display apparatus with a touch detection function, is provided in the region arranged on one side out of the display region in the direction in which the scanning signal lines extend. The circuit different from that of the transfer circuit included in the gate driver is provided at a position different from the transfer circuit in the direction in which the scanning signal lines extend.

However, an area ratio of a wiring and an element in the circuit different from the transfer circuit included in the gate driver is lower than an area ratio of a wiring and an element in the transfer circuit. Therefore, a vacant region is provided between two circuits different from the transfer circuit included in the gate driver, and the area of the region arranged on one side out of the display region in the direction in which the scanning signal lines extend cannot be decreased.

The present invention has been made to solve the problems in the conventional technique as described above, and an object of the present invention is to provide a display apparatus capable of reducing an area of a region arranged on one side out of a display region in a direction in which scanning signal lines extend.

The typical summary of the inventions disclosed in the present application will be briefly described as follows.

According to an aspect of the present invention, a display apparatus includes a substrate, a plurality of first pixels provided on a main surface side of the substrate, a first circuit to/from which a first scanning signal to be fed to the plurality of first pixels is input or output, and a first plurality of first scanning signal lines for connecting the plurality of first pixels and the first circuit to each other. The display apparatus further includes a first plurality of first scanning signal connection wirings for connecting the first circuit and each of the first plurality of first scanning signal lines. The substrate includes a first region serving as a region on the main surface side of the substrate and a second region serving as a region on the main surface side of the substrate and arranged on the first side out of the first region in a first direction. The plurality of first pixels are provided in the first region. The first circuit is provided in the second region and extends in a second direction intersecting the first direction when seen in a plan view. The first plurality of first scanning signal lines are provided in the first region, and respectively extend in the first direction and are arranged with a first pitch in the second direction when seen in a plan view. Each of the first plurality of first scanning signal connection wirings includes a first end on its first side in the first direction, the first plurality of the first ends included in the first plurality of first scanning signal connection wirings respectively are connected to the first circuit, and are arranged in the second direction when seen in a plan view. A distance in the second direction between the respective centers of any two of the first ends adjacent to each other is smaller than the first pitch.

And, as another aspect, a first average value of the distance in the second direction between the respective centers of the first ends adjacent to each other may be narrower than the first pitch.

And, as another aspect, the display apparatus may include a plurality of second pixels provided on the main surface side of the substrate, a second circuit to/from which a second scanning signal to be fed to the plurality of second pixels is input or output, and a second plurality of second scanning signal lines for connecting the plurality of second pixels and the second circuit. The display apparatus may further include a second plurality of second scanning signal connection wirings for connecting the second circuit and each of the second plurality of second scanning signal lines. The plurality of second pixels may be provided in the first region. The second circuit may be provided in the second region, and may extend in the second direction when seen in a plan view. The second plurality of second scanning signal lines may be provided in the first region, and may respectively extend in the first direction and may be arranged with a second pitch in the second direction when seen in a plan view. Each of the second plurality of second scanning signal lines may be arranged on the second side out of all of the first plurality of first scanning signal lines in the second direction when seen in a plan view. The second circuit may be spaced apart from the first circuit on the second side out of the first circuit in the second direction. Each of the second plurality of second scanning signal connection wirings may include a second end on its first side in the first direction, the second plurality of second ends respectively included in the second plurality of second scanning signal connection wirings may be connected to the second circuit, and may be arranged in the second direction when seen in a plan view. A second average value of a distance in the second direction between the respective centers of the second ends adjacent to each other may be narrower than the second pitch.

And, as another aspect, the display apparatus may include a first electrode that overlaps the plurality of first pixels and the plurality of second pixels when seen in a plan view and a third circuit that switches a first signal and a second signal and feeds the first or second signal to the first electrode. The third circuit may be arranged between the first circuit and the second circuit.

And, as another aspect, the display apparatus may include a second electrode to which the first signal is fed, a third electrode to which the second signal is fed, and a switching unit that switches the second electrode and the third electrode and connects the second or third electrode to the first electrode. The substrate may include a third region serving as a region on the main surface side of the substrate and arranged between the first region and the second region. The second electrode may be provided in the third region, and may extend in the second direction when seen in a plan view. The third electrode may be provided in the third region, and may extend in the second direction and may be arranged on the first side out of the second electrode in the first direction when seen in a plan view.

And, as another aspect, the switching unit may extend in the second direction and may be arranged between the second electrode and the third electrode when seen in a plan view. Any one of the first plurality of first scanning signal connection wirings may include a first extension portion extending in a direction different from the first direction, and any one of the second plurality of second scanning signal connection wirings may include a second extension portion extending in a direction different from the first direction. The first extension portion may overlap the third electrode when seen in a plan view, and the second extension portion may overlap the third electrode when seen in a plan view.

And, as another aspect, each of any two of the adjacent first scanning signal connection wirings among the first plurality of first scanning signal connection wirings may include the first extension portion, and each of any two of the adjacent second scanning signal connection wirings among the second plurality of second scanning signal connection wirings may include the second extension portion. A distance in the second direction between the centers of third ends on the first circuit side of the two first extension portions included in the two first scanning signal connection wirings, respectively, may be narrower than a distance in the second direction between the respective centers of fourth ends on the opposite side of the first circuit side of the two first extension portions, respectively. A distance in the second direction between the respective centers of fifth ends on the first circuit side of the two second extension portions included in the two second scanning signal connection wirings, respectively, may be narrower than a distance in the second direction between the respective centers of sixth ends on the opposite side of the first circuit side of the two second extension portions, respectively.

And, as another aspect, the switching unit may include a plurality of first switching elements and a plurality of second switching elements. The plurality of first switching elements may be arranged in the second direction when seen in a plan view, the plurality of second switching elements may be arranged in the second direction when seen in a plan view, and each of the plurality of second switching elements may be arranged on the second side out of all of the plurality of first switching elements in the second direction. Each of the plurality of first switching elements may include a first field effect transistor of a first conductivity type and a second field effect transistor of a second conductivity type different from the first conductivity type. Each of the plurality of second switching elements may include a third field effect transistor of the second conductivity type and a fourth field effect transistor of the first conductivity type. The second field effect transistor may be connected in series with the first field effect transistor, and the fourth field effect transistor may be connected in series with the third field effect transistor. A portion of the first field effect transistor on the second field effect transistor side may be connected to the first electrode, and a portion of the first field effect transistor on the opposite side of the second field effect transistor side may be connected to the second electrode, and a portion of the second field effect transistor on the opposite side of the first field effect transistor side may be connected to the third electrode. A portion of the third field effect transistor on the fourth field effect transistor side may be connected to the first electrode, a portion of the third field effect transistor on the opposite side of the fourth field effect transistor may be connected to the second electrode, and a portion of the fourth field effect transistor on the opposite side of the third field effect transistor side may be connected to the third electrode.

And, as another aspect, the third circuit may include a first feeding unit that feeds a first alternate-current signal and a second feeding unit that feeds a second alternate-current signal having an opposite phase to that of the first alternate-current signal. A first gate electrode of the first field effect transistor included in each of the plurality of first switching elements may be connected to the first feeding unit, and a second gate electrode of the second field effect transistor included in each of the plurality of first switching elements may be connected to the first feeding unit. A third gate electrode of the third field effect transistor included in each of the plurality of second switching elements may be connected to the second feeding unit, and a fourth gate electrode of the fourth field effect transistor included in each of the plurality of second switching elements may be connected to the second feeding unit.

And, as another aspect, each of any two of the adjacent first scanning signal connection wirings among the first plurality of first scanning signal connection wirings may include a third extension portion extending in a direction different from the first direction. A distance in the second direction between the respective centers of seventh ends on the first circuit side of the two third extension portions included in the two first scanning signal connection wirings, respectively, may be smaller than a distance in the second direction between the respective centers of eighth ends on the opposite side of the first circuit side of the two third extension portions, respectively.

And, as another aspect, the display apparatus may include a fourth circuit to which a third signal to be fed to the first circuit is input and which buffers the input third signal and feeds the buffered third signal to the first circuit. The fourth circuit may be arranged between the first circuit and the second circuit.

And, as another aspect, the display apparatus may include a fifth circuit that protects the first circuit from static electricity. The fifth circuit may be arranged between the first circuit and the second circuit.

And, as another aspect, the display apparatus may include a first scanning signal line group formed of the first plurality of first scanning signal lines. The first circuit may include a third plurality of first circuit units arranged in the second direction when seen in a plan view, the first scanning signal line group may include a third plurality of first partial groups formed of a fourth plurality of first scanning signal lines arranged in the second direction, and the first plural number may be the product of the third plural number and the fourth plural number. The third plurality of first circuit units may be connected to the third plurality of first partial groups, respectively, the third plurality of first partial groups may be arranged with a third pitch in the second direction, the third plurality of first circuit units may be arranged with a fourth pitch in the second direction, and the fourth pitch may be narrower than the third pitch.

And, as another aspect, the display apparatus may include a plurality of fourth electrodes each arranged opposite to the first electrode, and a detection unit that detects an input position based on a capacitance between each of the plurality of fourth electrodes and the first electrode. The third circuit may switch the first signal and the second signal and feed the first or second signal to the first electrode by switching the second electrode and the third electrode and connecting the second or third electrode to the first electrode by using the switching unit. The detection unit may detect the input position when the second signal is fed to the first electrode, and an image may be displayed in the plurality of first pixels and the plurality of second pixels when the first signal is fed to the first electrode.

BRIEF DESCRIPTIONS OF THE DRAWINGS

DESCRIPTIONS OF THE PREFERRED EMBODIMENTS

Figure 1:
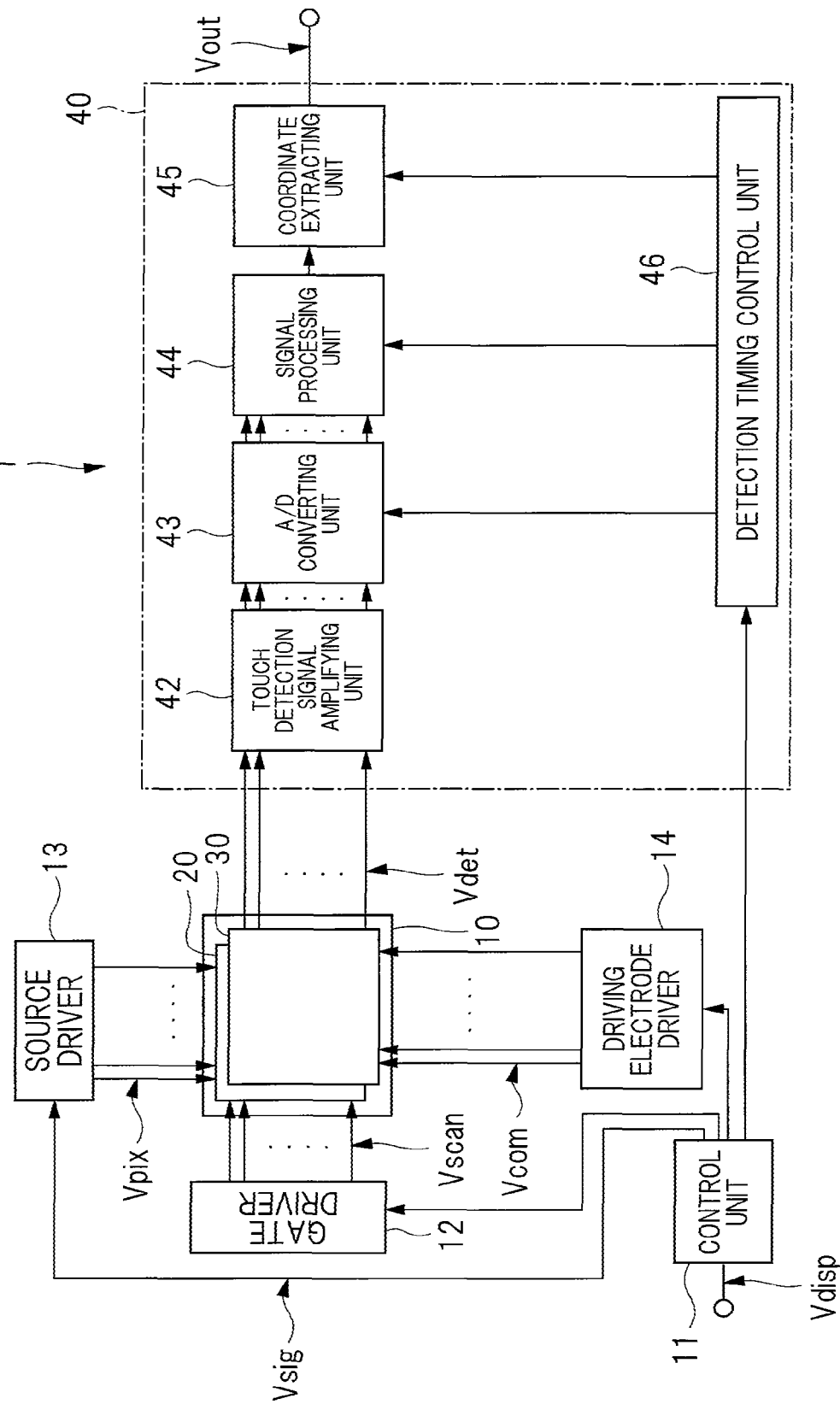
FIG. 1 is a block diagram illustrating a configuration example of a display apparatus according to a first embodiment.

Hereinafter, each embodiment of the present invention will be described with reference to the drawings.

Note that disclosure is merely one example, and appropriate change with keeping the concept of the present invention which can be easily thought up by those who skilled in the art is obviously contained in the scope of the present invention. Also, in order to make the clear description, the drawings are illustrated more schematically for a width, a thickness, a shape, and others of each portion than those in embodiments in some cases. However, they are merely examples, and do not restrict the interpretation of the present invention.

In the present specification and each drawing, similar elements of the existing drawings to those described above are denoted by the same reference characters, and detailed description thereof may be omitted in some cases.

Further, the drawings used in embodiments, hatching added to distinguish structures may be omitted in some cases depending on the drawings.

In the following embodiments, when a range is described as "A to B", the range is described a range larger than A and smaller than B unless otherwise clearly specified.

First Embodiment

First, as a first embodiment, an example in which a display apparatus is applied to a liquid crystal display apparatus with a touch detection function will be described. Here, the liquid crystal display apparatus with a touch detection function is a liquid crystal display apparatus provided with a detection electrode for touch detection in either one of an array substrate and an opposite substrate included in the display apparatus. In the first embodiment, a liquid crystal display apparatus with a touch detection function of an in-cell type having such a feature that a driving electrode is provided so as to operate as a touch panel driving electrode will be further described.

<Entire Configuration>

First, an entire configuration of the display apparatus according to the first embodiment will be described with reference to FIG. 1. FIG. 1 is a block diagram illustrating an example of one configuration of the display apparatus according to the first embodiment.

The display apparatus 1 include a display device with a touch detection function 10, a control unit 11, a gate driver 12, a source driver 13, a driving electrode driver 14, and a touch detection unit 40.

A display device with a touch detection function 10 includes a display device (liquid crystal display device) 20 and a touch detection device 30. In the first embodiment, the display device 20 is a display device using a liquid crystal display element as a display element. The touch detection device 30 is a touch detection device of a capacitance system, i.e., a capacitance-type touch detection device. Therefore, the display apparatus 1 is a display apparatus including an input device having a touch detection function. The display device with the touch detection function 10 is a display device obtained by integrating the display device 20 and the touch detection device 30, which is a display device in which a touch detection function is embedded, i.e., a display device with a touch detection function of an in-cell type.

Note that the display device 20 may be a display device using, for example, an organic Electroluminescence (EL) display device instead of the display device using the liquid crystal display element.

The display device 20 performs display by sequentially scanning each horizontal line in a display region according to a scanning signal Vscan fed from the gate driver 12. As described below, the touch detection device 30 operates based on a principle of capacitance-type touch detection, and outputs a detection signal Vdet.

The control unit 11 is a circuit that feeds a control signal to each of the gate driver 12, the source driver 13, the driving electrode driver 14, and the touch detection unit 40 based on a video signal Vdisp fed from the outside and controls them so as to operate in synchronization with one another.

The gate driver 12 has a function of sequentially selecting one horizontal line to be a display driving target of the display device with the touch detection function 10 based on the control signal fed from the control unit 11.

The source driver 13 is a circuit that feeds a pixel signal Vpix to a sub-pixel SPix (see FIG. 6 described below) included in the display device with the touch detection function 10 based on the control signal for an image signal Vsig fed from the control unit 11.

The driving electrode driver 14 is a circuit that feeds a driving signal Vcom to a driving electrode COML (see FIG. 4 or 5 described below) included in the display device with the touch detection function 10 based on the control signal fed from the control unit 11.

The touch detection unit 40 is a circuit that detects whether an input tool such as a finger or a touch pen touches the touch detection device 30 or not, i.e., whether a contacting or closely-coming state of the touch detection device 30 described below is presented or not, based on the control signal fed from the control unit 11 and the detection signal Vdet fed from the touch detection device 30 in the display device with the touch detection function 10. And, the touch detection unit 40 is a circuit that obtains, when the touch is detected, coordinates of the touch, i.e., an input position in a touch detection region. The touch detection unit 40 includes a touch detection signal amplifying unit 42, an A/D (Analog/Digital) converting unit 43, a signal processing unit 44, a coordinate extracting unit 45, and a detection timing control unit 46.

The touch detection signal amplifying unit 42 amplifies the detection signals Vdet fed from the touch detection device 30. The touch detection signal amplifying unit 42 may include a low-pass analog filter that removes a high frequency component included in the detection signal Vdet, i.e., a noise component therein and extracts and outputs a touch component.

<Principle of Capacitance-Type Touch Detection>

Figure 2:
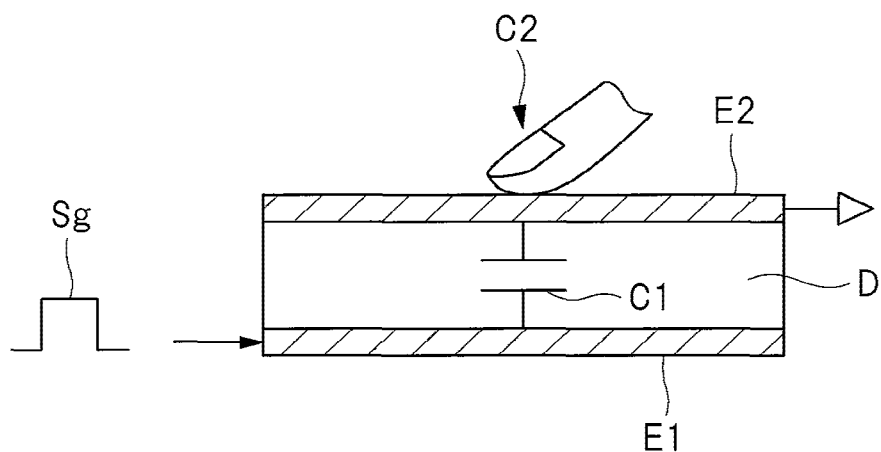
FIG. 2 is an explanatory diagram illustrating a state that a finger comes into contact with or comes close to a touch detection device.
Figure 3:
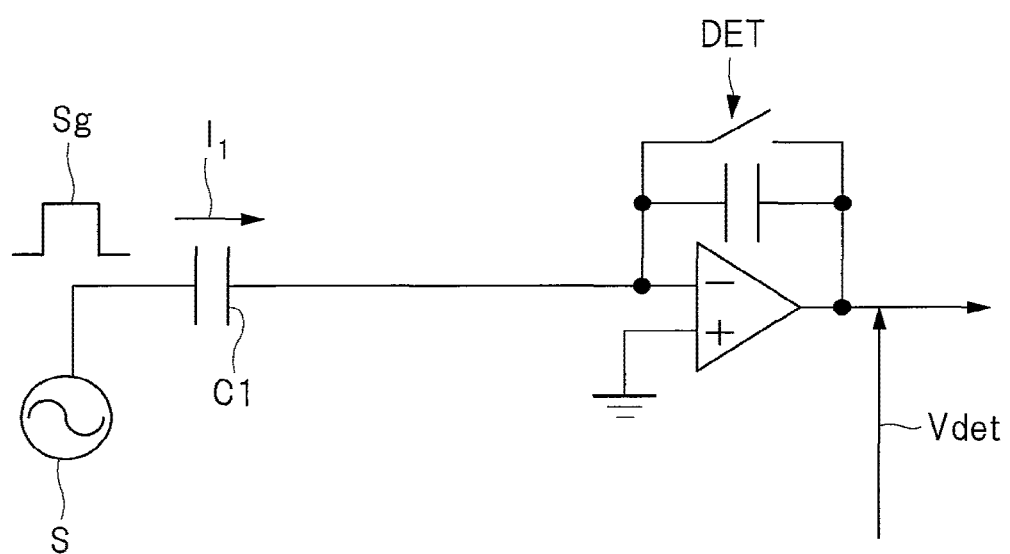
FIG. 3 is an explanatory diagram illustrating an equivalent circuit in the state that the finger comes into contact with or come close to the touch detection device.

Next, a principle of touch detection in the display apparatus 1 according to the present embodiment will be described with reference to FIGS. 1 to 3. FIG. 2 is an explanatory diagram illustrating a state that a finger has come into contact with or come close to the touch detection device. FIG. 3 is an explanatory diagram illustrating an example of an equivalent circuit of the state that the finger has come into contact with or come close to the touch detection device.

As illustrated in FIG. 2, in capacitance-type touch detection, an input device called a touch panel or a touch sensor has a driving electrode E1 and a detection electrode E2 arranged opposite to each other so as to interpose a dielectric body "D" therebetween. By these driving electrode E1 and detection electrode E2, a capacitive element C1 is formed. As illustrated in FIG. 3, one end of the capacitive element C1 is connected to an alternating-current signal source "S" serving as a driving signal source, and the other end of the capacitive element C1 is connected to a voltage detector DET serving as a touch detection unit. The voltage detector DET is configured of, for example, an integration circuit included in the touch detection signal amplifying unit 42 illustrated in FIG. 1.

When an alternate-current rectangular wave "Sg" having a frequency of, for example, about several kHz to several hundred kHz is applied from the alternate-current signal source S to one end of the capacitive element C1, i.e., to the driving electrode E1, a detection signal Vdet serving as an output wavelength is generated via the voltage detector DET connected to the other end of the capacitive element C1, i.e., the detection electrode E2 side.

As illustrated in FIG. 3, in a state that the finger has not come into contact therewith or come close thereto, i.e., in a non-contact state, a current $I_1$ corresponding to a capacitance value of the capacitive element C1 is flowed by charge/discharge of the capacitive element C1. The voltage detector DET converts a variation of the current $I_1$ corresponding to the alternate-current rectangular wave Sg into a voltage variation.

On the other hand, in the state that the finger has come into contact therewith or come close thereto, i.e., in a contact state, a capacitance value of the capacitive element C1 formed by the driving electrode E1 and the detection electrode E2 decreases because of being affected by a capacitance C2 formed by the finger. Therefore, the current $I_1$ flowing through the capacitive element C1 illustrated in FIG. 3 varies. The voltage detector DET converts the variation of the current $I_1$ corresponding to the alternate-current rectangular wave Sg into a voltage variation.

In the example illustrated in FIG. 1, the touch detection device 30 performs touch detection for each driving range including one or a plurality of driving electrodes COML (see FIG. 5 or 6, described below) in accordance with the driving signal Vcom fed from the driving electrode driver 14. That is, the touch detection device 30 outputs the detection signal Vdet via the voltage detector DET illustrated in FIG. 3 for each driving range including one or a plurality of driving electrodes COML, and feeds the output detection signal Vdet to the touch detection signal amplifying unit 42 in the touch detection unit 40.

The A/D conversion unit 43 is a circuit that samples each analog signal output from the touch detection signal amplification unit 42 at a timing synchronized with the driving signal Vcom, and converts the analog signal into a digital signal.

The signal processing unit 44 includes a digital filter that reduces a frequency component other than a frequency at which the driving signal Vcom is sampled, i.e., a noise component, which is included in an output signal of the A/D converting unit 43. The signal processing unit 44 is a logical circuit that detects whether the touch detection device 30 has been touched or not based on the output signal of the A/D conversion unit 43. The signal processing unit 44 performs processing for extracting only a difference voltage caused by the finger. The signal processing unit 44 compares the detected difference voltage caused by the finger with a predetermined threshold voltage, and determines that an externally-coming object which comes close from outside is in a contact state if the voltage of the difference is in a contact state if the difference voltage is equal to or larger than the threshold voltage, and determines that the externally-coming object is in a non-contact state if the difference voltage is smaller than the threshold voltage. Thus, touch detection is performed by the touch detection unit 40.

The coordinate extracting unit 45 is a logical circuit that obtains, when the touch has been detected in the signal processing unit 44, coordinates of a position where the touch has been detected, i.e., an input position in the touch panel. The detection timing control unit 46 performs control so that the A/D converting unit 43, the signal processing unit 44, and the coordinate extracting unit 45 operate in synchronization with one another. The coordinate extracting unit 45 outputs touch panel coordinates as a signal output Vout.

<Module>

Figure 4:
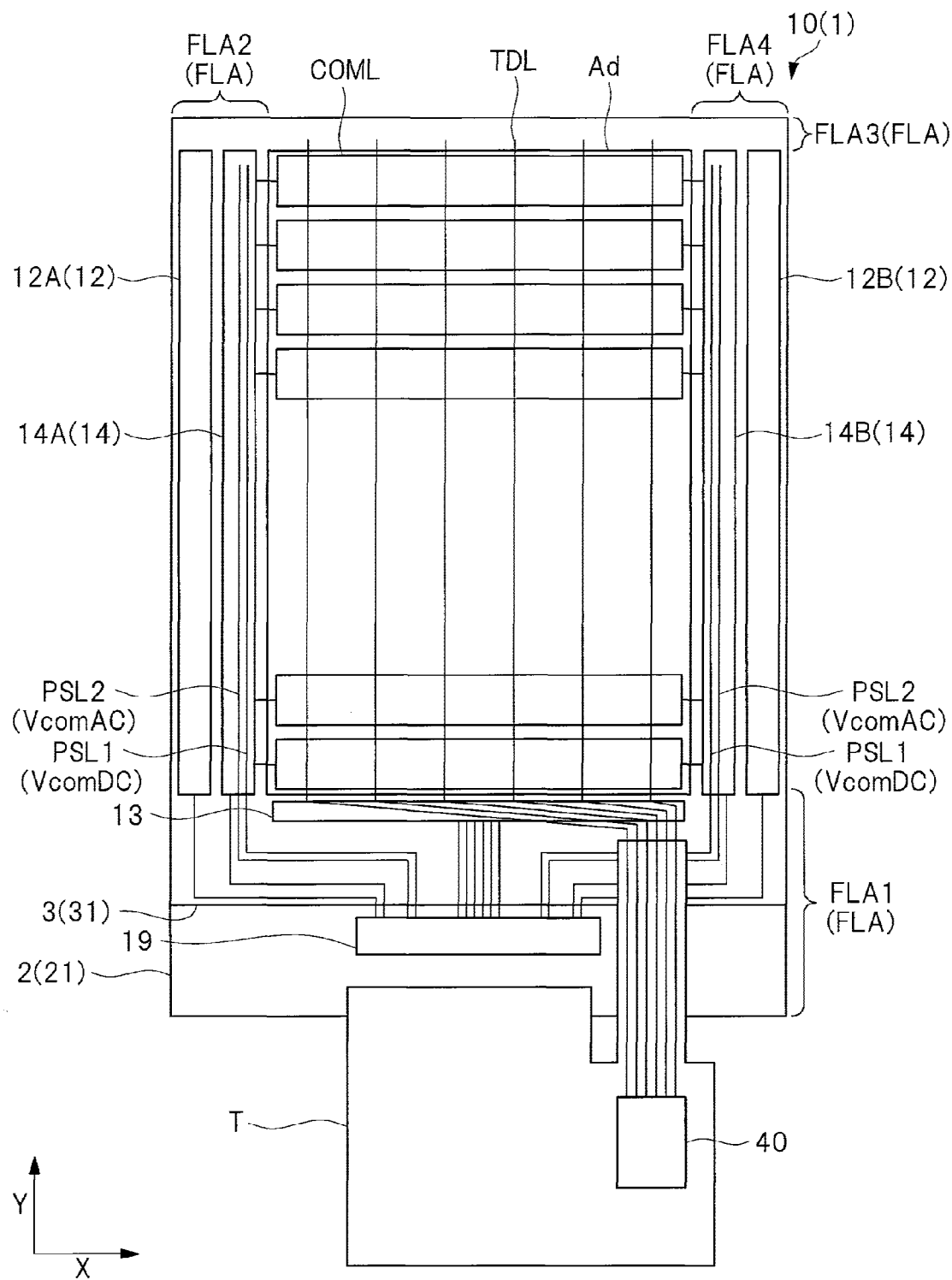
FIG. 4 is a diagram illustrating an example of a module on which the display apparatus according to the first embodiment is mounted.

FIG. 4 is a diagram illustrating an example of a module on which the display apparatus 1 according to the first embodiment is mounted.

As illustrated in FIG. 4, the display apparatus 1 includes an array substrate 2 including a substrate 21, an opposite substrate 3 including a substrate 31, and a flexible printed circuit board T.

The substrate 21 includes a display region Ad and a frame region FLA. The display region Ad is a region on an upper surface 21*a* side (see FIG. 5 described below) serving as a main surface of the substrate 21, the region being provided with a plurality of pixels Pix (see FIG. 7 described below) included in the display device 20. That is, the display region Ad is a region where an image is displayed. The frame region FLA is a region on the upper surface side (see FIG. 5 described below) serving as the main surface of the substrate 21, the region being closer to the outer periphery of the substrate 21 than the display region Ad. That is, the frame region FLA is a region where no image is displayed.

Here, two directions, which intersect each other, more preferably is perpendicular to each other, in the upper surface 21*a* serving as the main surface of the substrate 21 are set to an X-axis direction and a Y-axis direction, respectively. In an example illustrated in FIG. 4, when seen in a plan view, the substrate 21 has two sides each extending in the X-axis direction and two sides each extending in the Y-axis direction and has a rectangular shape. Therefore, in the example illustrated in FIG. 4, the frame region FLA is a frame-shaped region in periphery of the display region Ad.

In the specification of the present application, note that the term "when seen in a plan view" means a case of view from a direction perpendicular to the upper surface 21*a* (see FIG. 5 described below) serving as the main surface of the substrate 21. And, hereinafter, the term "on the upper surface 21*a* serving as the main surface of the substrate 21" may be simply referred to as "on the substrate 21".

On the substrate 21, a COG (Chip On Glass) 19 is mounted. The COG 19 is an IC (Integrated Circuit) chip mounted on the substrate 21, and is a control device in which each circuit required for a display operation such as the control unit 11 and the source driver 13 illustrated in FIG. 1 is embedded.

On the substrate 21, the source driver 13 is provided. The source driver 13 may be embedded in the COG 19.

On the substrate 21, gate drivers 12A and 12B serving as the gate driver 12 are provided. And, on the substrate 21, driving electrode drivers 14A and 14B serving as the driving electrode driver 14 are provided. The gate drivers 12A and 12B and the driving electrode drivers 14A and 14B are provided in the frame region FLA.

Here, a region in the frame region FLA, the region being arranged on the negative side out of the display region Ad in the Y-axis direction, is set to a frame region FLA1, and a region in the frame region FLA, the region being arranged on the negative side of the display region Ad in the X-axis direction, is set to a frame region FLA2. And, a region in the frame region FLA, the region being arranged on the positive side of the display region Ad in the Y-axis direction, is set to a frame region FLA3, and a region in the frame region FLA, the region being arranged on the positive side of the display region Ad in the X-axis direction, is set to a frame region FLA4. At this time, the gate driver 12A and the driving electrode driver 14A are provided in the frame region FLA2, and the gate driver 12B and the driving electrode driver 14B are provided in the frame region FLA4.

As illustrated in FIG. 4, the display apparatus 1 includes a plurality of driving electrodes COML and a plurality of detection electrodes TDL. The plurality of driving electrodes COML and the plurality of detection electrodes TDL are electrodes for touch detection, and an input position is detected based on a capacitance between each of the plurality of driving electrodes COML and each of the plurality of detection electrodes TDL. Each of the plurality of driving electrodes COML extends in the X-axis direction and is arranged in the Y-axis direction when seen in a plan view. Each of the plurality of detection electrodes TDL extends in the Y-axis direction and is arranged in the X-axis direction when seen in a plan view.

When a touch detection operation is performed, a detection driving signal VcomAC serving as the driving signals Vcom (see FIG. 1) is sequentially fed to each of the plurality of driving electrodes COML by the driving electrode driver 14. An output of each of the plurality of detection electrodes TDL is connected to the touch detection unit 40 mounted on the flexible printed circuit board T through the flexible printed circuit board T. The flexible printed circuit board T may be a terminal, and is not limited to a flexible printed circuit board. In this case, the touch detection unit 40 is provided outside a module.

As described below with reference to FIG. 6, a large number of pixels Pix formed of the plurality of sub-pixels SPix are arranged in a matrix form in the display region Ad.

As described above, the gate driver 12A is provided in the frame region FLA2, and the gate driver 12B is provided in the frame region FLA4.

The gate drivers 12A and 12B are provided so as to sandwich the display region Ad serving as a region where the below-described sub-pixels SPix are arranged in the matrix form therebetween, to drive the sub-pixels SPix from both the sides.

The driving electrode drivers 14A and 14B are connected to both the positive and negative sides in the X-axis direction of each of the plurality of driving electrodes COML arranged in the Y-axis direction. To the driving electrode drivers 14A and 14B, a display driving signal VcomDC serving as the display driving signal Vcom (see FIG. 1) is fed from, for example, a driving signal generation portion (not illustrated) included in the COG 19 via a power supply wiring PSL1 serving as an electrode. And, to the driving electrode drivers 14A and 14B, a detection driving signal VcomAC serving as the driving signal for touch detection Vcom (see FIG. 1) is fed via a power supply wiring PSL2 serving as an electrode. That is, the display driving signal VcomDC is fed to the power supply wiring PSL1, and the detection driving signal VcomAC is fed to the power supply wiring PSL2.

The power supply wiring PSL1 is arranged on the display region Ad side out of the power supply wiring PSL2. That is, the power supply wiring PSL2 is arranged on the negative side out of the power supply wiring PSL1 in the X-axis direction in the frame region FLA2, and the power supply wiring PSL2 is arranged on the positive side out of the power supply wiring PSL1 in the X-axis direction in the frame region FLA4. By such an arrangement, the display driving signal VcomDC fed by the power supply wiring PSL1 stabilizes a potential state at an end of the display region Ad. Thus, display is stabilized particularly in a display device using a liquid crystal of a transverse electric field mode.

<Display Device with Touch Detection Function>

Figure 5:
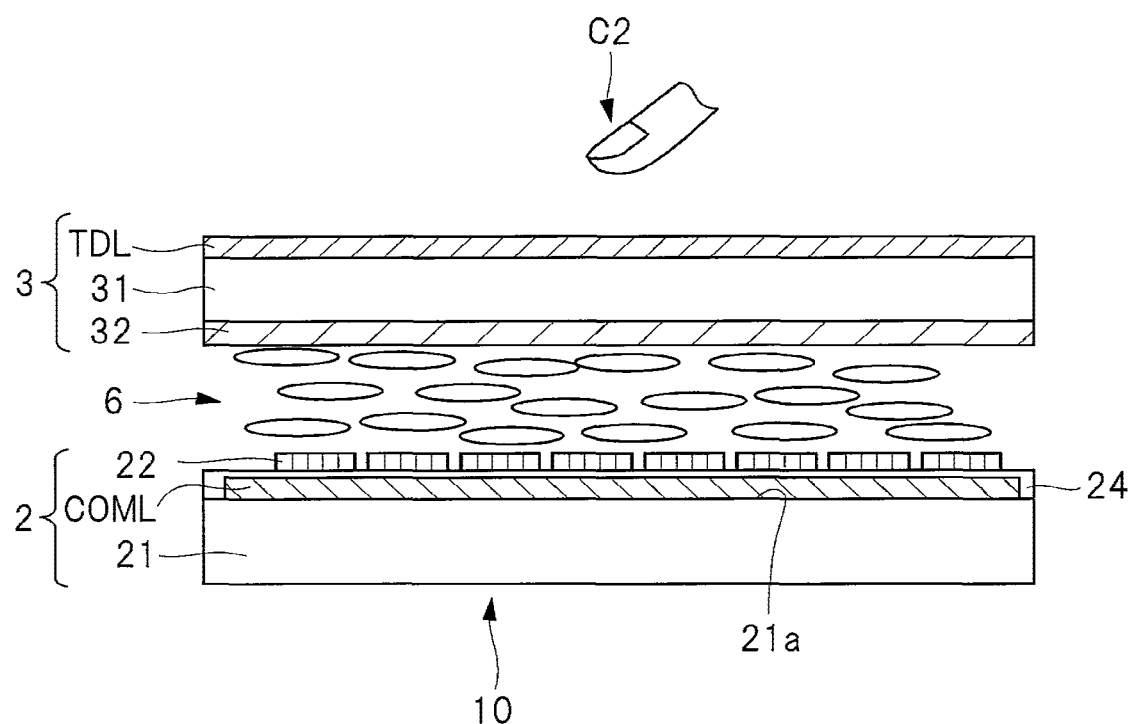
FIG. 5 is a cross-sectional view illustrating a display device with a touch detection function in the display apparatus according to the first embodiment.
Figure 7:
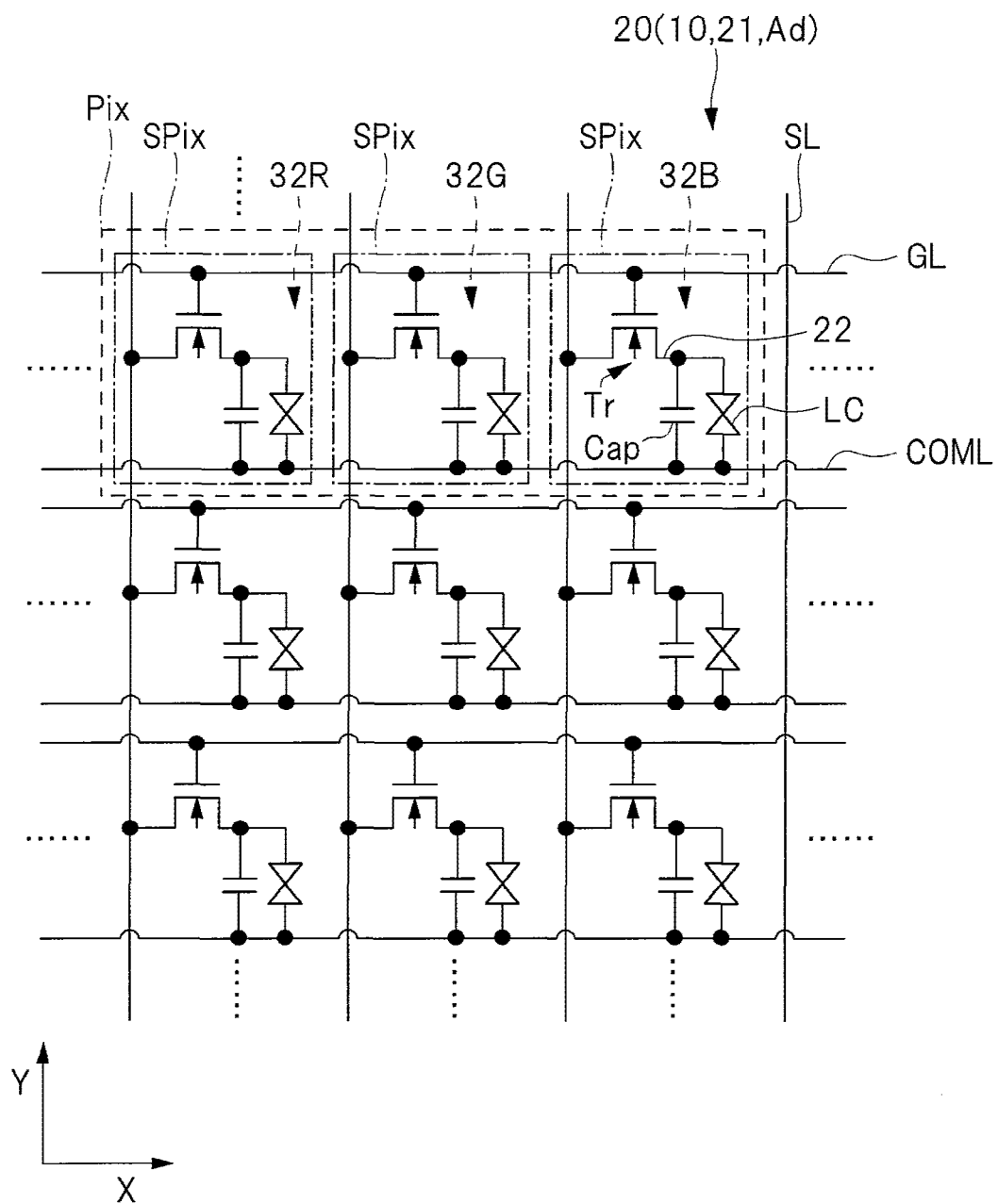
FIG. 7 is a circuit diagram illustrating a display device with a touch detection function in the display apparatus according to the first embodiment.
Figure 8:
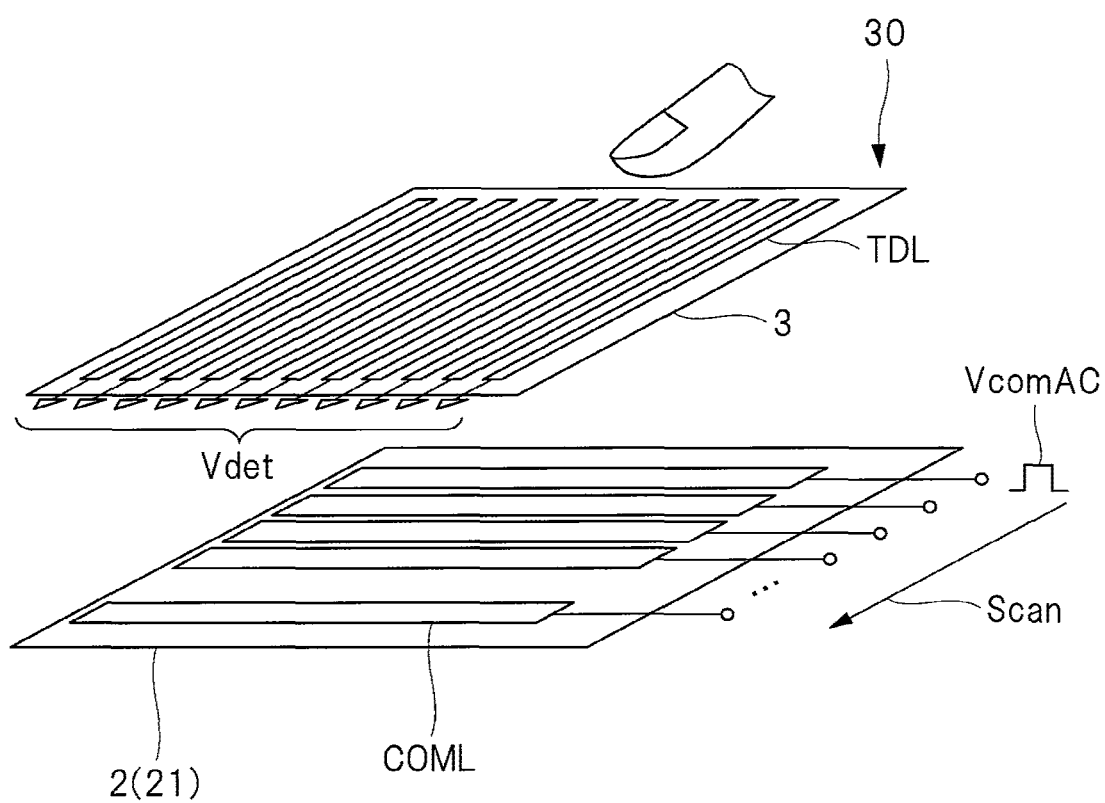
FIG. 8 is a perspective view illustrating an example of a configuration of a driving electrode and a detection electrode in the display apparatus according to the first embodiment.

Next, with reference to FIG. 4 and FIGS. 5 to 8, a configuration example of the display device with a touch detection function 10 will be described in detail. FIG. 5 is a cross-sectional view illustrating a display device with a touch detection function in the display apparatus according to the first embodiment. FIGS. 6 and 7 are circuit diagrams illustrating the display device with a touch detection function in the display apparatus according to the first embodiment. FIG. 8 is a perspective view illustrating one configuration example of a driving electrode and a detection electrode in the display apparatus according to the first embodiment.

The display device with a touch detection function 10 includes an array substrate 2, an opposite substrate 3, and a liquid crystal layer 6. The opposite substrate 3 is arranged opposite to the array substrate 2 so that an upper surface serving as a main surface of the array substrate 2 and a lower surface serving as a main surface of the opposite substrate 3 oppose each other. The liquid crystal layer 6 is provided between the array substrate 2 and the opposite substrate 3.

The array substrate 2 includes a substrate 21. The opposite substrate 3 includes a substrate 31. The substrate 31 has an upper surface serving as one main surface and a lower surface serving as the other main surface on the opposite side of the upper surface, and is arranged opposite to the substrate 21 so that the upper surface serving as a main surface of the substrate 21 and the lower surface serving as the main surface of the substrate 31 oppose each other. The liquid crystal layer 6 is sandwiched between the upper surface of the substrate 21 and the lower surface of the substrate 31. Note that the upper surface of the substrate 21 is referred to as an upper surface 21a as described above.

Figure 6:
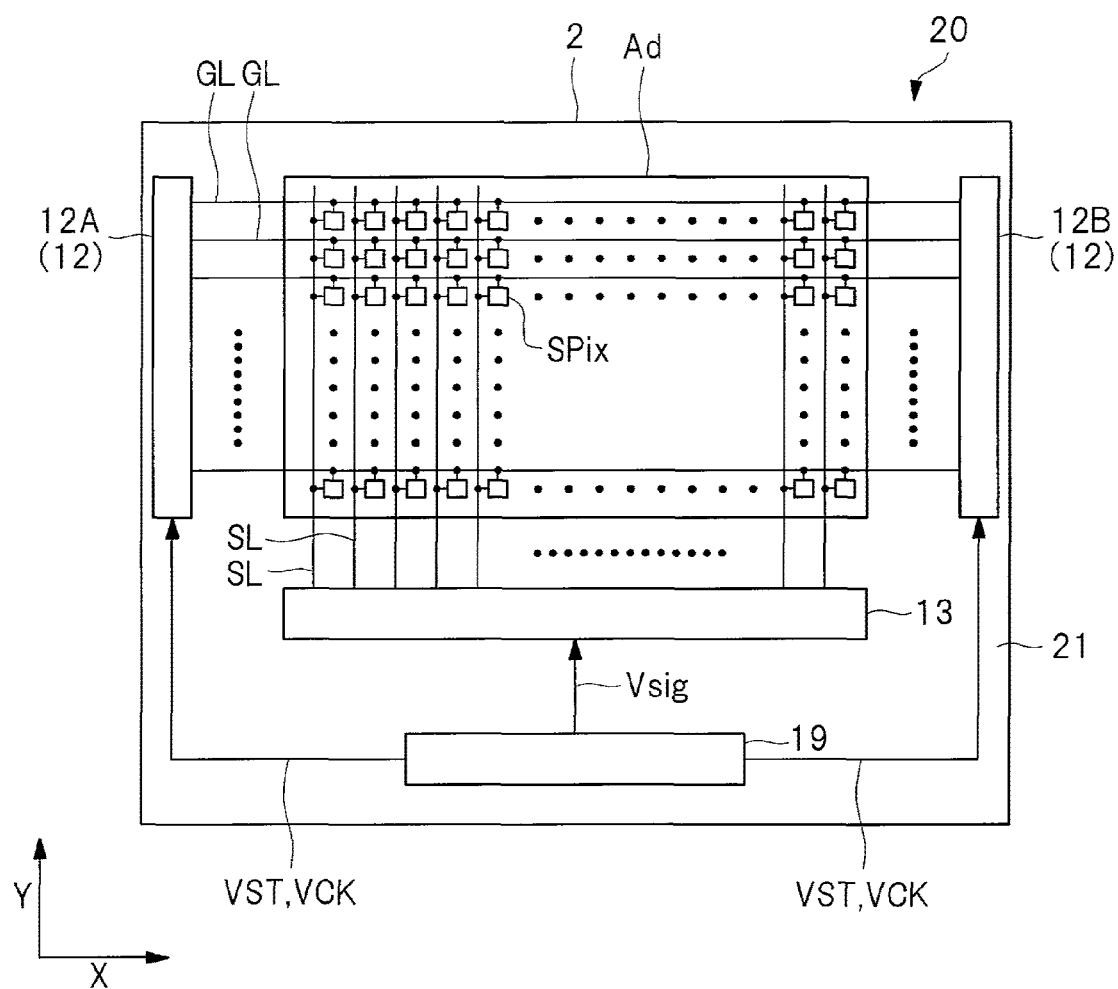
FIG. 6 is a circuit diagram illustrating a display device with a touch detection function in the display apparatus according to the first embodiment.

As illustrated in FIG. 6, the array substrate 2 includes the display region Ad, the COG 19, the gate drivers 12A and 12B, and the source driver 13 on the substrate 21. The flexible printed circuit board T illustrated in FIG. 4 transmits an external signal to the COG 19 or driving power for driving the COG 19.

As illustrated in FIGS. 6 and 7, the sub-pixels SPix are arranged in a matrix form (row-column form) in the display region Ad. As illustrated in FIG. 7, one pixel Pix is formed by the plurality of sub-pixels SPix having different colors.

In the specification of the present application, note that a row means a pixel row having a plurality of sub-pixels SPix arranged in one direction (the X-axis direction). A column means a pixel column having a plurality of sub-pixels SPix arranged in a direction intersecting the direction which is in the row arrangement, more preferably perpendicular thereto (the Y-axis direction).

As illustrated in FIG. 6, in the display region Ad, each of a plurality of scanning signal lines GL extends in the X-axis direction and is arranged in the Y-axis direction. In the display region Ad, each of a plurality of video signal lines SL extends in the Y-axis direction and is arranged in the X-axis direction. Therefore, each of the plurality of video signal lines SL intersects the plurality of scanning signal lines GL when seen in a plan view. In this manner, when seen in a plan view, the sub-pixels SPix are arranged at intersections between the plurality of scanning signal lines GL and the plurality of video signal liens SL that intersect each other, respectively.

To the COG 19, a master clock, a horizontal synchronizing signal, and a vertical synchronizing signal are input from the outside of the array substrate 2. The COG 19 generates a vertical start pulse VST and a vertical clock pulse VCK based on the master clock, the horizontal synchronizing signal, and the vertical synchronizing signal input to the COG 19, and feeds the generated pulses to each of the gate drivers 12A and 12B.

Each of the gate drivers 12A and 12B sequentially outputs a scanning signal based on the input vertical start pulse VS and vertical clock pulse VCK and feeds the output scanning signal to the scanning signal line GL, so that the sub-pixels SPix are sequentially selected for each row.

The image signals Vsig in, for example, red (R), green (G), and blue (B), are fed to the source driver 13. The source driver 13 feeds the pixel signals Vpix (see FIG. 1) via the video signal line SL to each sub-pixel SPix in the row selected by the gate drivers 12A and 12B for one pixel or a plurality of pixels.

As illustrated in FIG. 7, when seen in a plan view, a thin film transistor (TFT) element serving as a field-effect transistor, that is, a TFT element Tr is formed at an intersection at which each of the plurality of scanning signal lines GL and each of the plurality of video signal lines SL intersect each other. Therefore, the plurality of TFT elements Tr are formed on the substrate 21 in the display region Ad, and the plurality of TFT elements Tr are arranged in a matrix form in the X-axis direction and the Y-axis direction. That is, the TFT element Tr is provided in each of the plurality of sub-pixels SPix. A liquid crystal element LC is provided in addition to the TFT element Tr in each of the plurality of sub-pixels SPix.

The TFT element Tr is formed of, for example, a thin film transistor serving as an n-channel MOS (Metal Oxide Semiconductor). A gate electrode of the TFT element Tr is connected to the scanning signal line GL. One of a source electrode and a drain electrode of the TFT element Tr is connected to the video signal line SL. The other of the source electrode and the drain electrode of the TFT element Tr is connected to one end of the liquid crystal element LC. And, for example, one end of the liquid crystal element LC is connected to the source electrode or the drain electrode of the TFT element Tr, and the other end thereof is connected to the driving electrode COML.

As illustrated in FIG. 5, the array substrate 2 includes the substrate 21, the plurality of driving electrodes COML, an insulating film 24, and a plurality of pixel electrodes 22. The plurality of driving electrodes COML are provided on the upper surface 21a serving as the one main surface of the substrate 21 in the display region Ad when seen in a plan view. The insulating film 24 is formed on the upper surface 21a of the substrate 21 including each surface of the plurality of driving electrodes COML. In the display region Ad, the plurality of pixel electrodes 22 are formed on the insulating film 24. Therefore, the insulating film 24 electrically insulates the driving electrode COML and the pixel electrode 22.

As illustrated in FIG. 7, when seen in a plan view, each of the plurality of pixel electrodes 22 is formed in each of the plurality of sub-pixels SPix arranged in a matrix form in the X-axis direction and the Y-axis direction in the display region Ad. Therefore, the plurality of pixel electrodes 22 are arranged in a matrix form in the X-axis direction and the Y-axis direction.

In the example illustrated in FIG. 5, each of the plurality of driving electrodes COML is formed between the substrate 21 and the pixel electrodes 22. As schematically illustrated in FIG. 7, each of the plurality of driving electrodes COML is provided to overlap the plurality of pixel electrodes 22 when seen in a plan view. When a voltage is applied between each of the plurality of pixel electrodes 22 and each of the plurality of driving electrodes COML, an electric field is formed between each of the plurality of pixel electrodes 22 and each of the plurality of driving electrodes COML, i.e., in the liquid crystal element LC provided in each of the plurality of sub-pixels SPix, so that an image is displayed in the display region Ad. At this time, a capacitance Cap is formed between the driving electrode COML and the pixel electrode 22, and the capacitance Cap functions as a retentive capacity.

As illustrated in FIG. 7, the display device 20 is formed of the plurality of liquid crystal elements LC, the plurality of pixel electrodes 22, the plurality of driving electrodes COML, the plurality of scanning signal lines GL, and the plurality of video signal lines SL. The display device 20 controls the image display in the display region Ad by controlling the voltage applied between each of the plurality of pixel electrodes 22 and each of the plurality of driving electrodes COML.

Note that each of the plurality of driving electrodes COML may be formed on the opposite side of the substrate 21 through the pixel electrode 22. In the example illustrated in FIG. 5, an arrangement of the driving electrodes COML and the pixel electrodes 22 is an arrangement in a FFS (Fringe Field Switching) mode serving as a transverse electric field mode in which the driving electrode COML and the pixel electrode 22 overlap each other when seen in a plan view. However, the arrangement of the driving electrodes COML and the pixel electrodes 22 may be an arrangement in an IPS (In Plane Switching) mode serving as a transverse electric field mode in which the driving electrode COML and the pixel electrode 22 do not overlap each other when seen in a plan view. Alternatively, the arrangement of the driving electrodes COML and the pixel electrodes 22 may be an arrangement in a TN (Twisted Nematic) mode or a VA (Vertical Alignment) mode serving as a vertical electric field mode.

The liquid crystal layer 6 modulates light passing through the liquid crystal layer depending on a state of the electric field, and a liquid crystal layer supporting the transverse electric field mode such as the FFS mode or the IPS mode described above is used for the liquid crystal layer. Note that an orientation film may be provided between the liquid crystal layer 6 and the array substrate 2 and between the liquid crystal layer 6 and the opposite substrate 3 illustrated in FIG. 5.

Each of the gate drivers 12A and 12B sequentially selects one row (one horizontal line) of the sub-pixels SPix arranged in the matrix form in the display region Ad as a display driving target by feeding the scanning signal Vscan (see FIG. 1) to the gates of the TFT elements Tr in the sub-pixels SPix via the scanning signal line GL. The source driver 13 feeds the pixel signal Vpix (see FIG. 1) to each of the sub-pixels SPix included in the one horizontal line sequentially selected by the gate drivers 12A and 12B, via the signal line SL. In these sub-pixels SPix, a display operation in the one horizontal line is performed in response to the fed pixel signal Vpix.

When the display operation is performed, each of the driving electrode drivers 14A and 14B serving as the driving electrode driver 14 feeds the display driving signal VcomDC to the driving electrode COML to drive the driving electrode COML. As described below with reference to FIG. 9, the plurality of sub-pixels SPix belonging to, for example, the plurality of rows, share one driving electrode COML. Each of the plurality of driving electrodes COML extends in the X-axis direction and is arranged in the Y-axis direction in the display region Ad.

As described above, each of the plurality of scanning signal lines GL extends in the X-axis direction and is arranged in the Y-axis direction in the display region Ad, and therefore, a direction in which each of the plurality of driving electrodes COML extends is parallel to a direction in which each of the plurality of scanning signal lines GL extends. However, the direction in which each of the plurality of driving electrodes COML extends is not limited. For example, the direction in which each of the plurality of driving electrodes COML extends may be parallel to a direction in which each of the plurality of video signal lines SL extends.

The driving electrode COML in the display apparatus 1 according to the first embodiment operates as an electrode for driving the display device 20, and operates as an electrode for driving the touch detection device 30.

As illustrated in FIG. 8, the touch detection device 30 has the plurality of driving electrodes COML provided in the array substrate 2 and the plurality of detection electrodes TDL provided in the opposite substrate 3. Each of the plurality of detection electrodes TDL extends in a direction intersecting the direction in which each of the plurality of driving electrodes COML extends when seen in a plan view. In other words, the plurality of detection electrodes TDL are spaced apart from one another to intersect each of the plurality of driving electrodes COML when seen in a plan view.

Each of the plurality of detection electrodes TDL is arranged opposite to each of the plurality of driving electrodes COML in a direction perpendicular to the upper surface of the substrate 21 included in the array substrate 2.

Each of the plurality of detection electrodes TDL is connected to the touch detection signal amplification unit 42

(see FIG. 1) in the touch detection unit 40. A capacitance is generated at an intersection between each of the plurality of driving electrodes COML and each of the plurality of detection electrodes TDL when seen in a plan view. An input position is detected based on the capacitance between each of the plurality of driving electrodes COML and each of the plurality of detection electrodes TDL. That is, the touch detection unit 40 detects the input position based on the capacitance between each of the plurality of driving electrodes COML and each of the plurality of detection electrodes TDL.

In the touch detection device 30, when a touch detection operation is performed, for example, one or a plurality of driving electrodes COML are sequentially selected by the driving electrode driver 14 (see FIG. 1) along a scanning direction Scan. A detection driving signal VcomAC is fed and input to the selected one or plurality of driving electrodes COML, and a detection signal Vdet for detecting the input position is generated and output from the detection electrode TDL. As described above, in the touch detection device 30, the touching is detected for each driving range including the selected one or plurality of driving electrodes COML. The one or plurality of driving electrodes COML included in the one driving range correspond to the driving electrode E1 in a principle of the touch detection described above, and the detection electrode TDL corresponds to the detection electrode E2 therein.

When seen in a plan view, the plurality of driving electrodes COML and the plurality of detection electrodes TDL, which intersect each other form capacitance-type touch sensors arranged in a matrix form. Therefore, a position at which a finger or others has come into contact and come close can be detected by scanning an entire touch detection surface of the touch detection device 30.

As illustrated in FIG. 5, the opposite substrate 3 includes the substrate 31, a color filter 32, and the detection electrode TDL. The color filter 32 is formed on the lower surface serving as one main surface of the substrate 31. The detection electrode TDL is a detection electrode of the touch detection device 30, and is formed on the upper surface serving as the other main surface of the substrate 31.

As the color filter 32, color filters colored in, for example, three colors of red (R), green (G), and blue (B), are arranged in the X-axis direction. Thus, as illustrated in FIG. 7, the plurality of sub-pixels SPix corresponding to color regions 32R, 32G, and 32G in three colors R, G, and B are formed, and one pixel Pix is formed of the plurality of sub-pixels SPix corresponding to one set of color regions 32R, 32G, and 32, respectively.

A combination of the colors of the color filter 32 may be a combination of a plurality of colors including other colors except for R, G, and B. The color filter 32 may be not provided. Alternatively, one pixel Pix may include a sub-pixel SPix provided with no color filter 32, i.e., a sub-pixel SPix in a white color. Alternatively, the color filter may be provided in the array substrate 2 by a COA (Color Filter On Array) technique.

Note that a polarizing plate (not illustrated) may be provided on the opposite side of the opposite substrate 3 across the array substrate 2, and a polarizing plate (not illustrated) may be provided on the opposite side of the array substrate 2 across the opposite substrate 3.

<Configuration of Gate Driver and Driving Electrode Driver>

Figure 9:
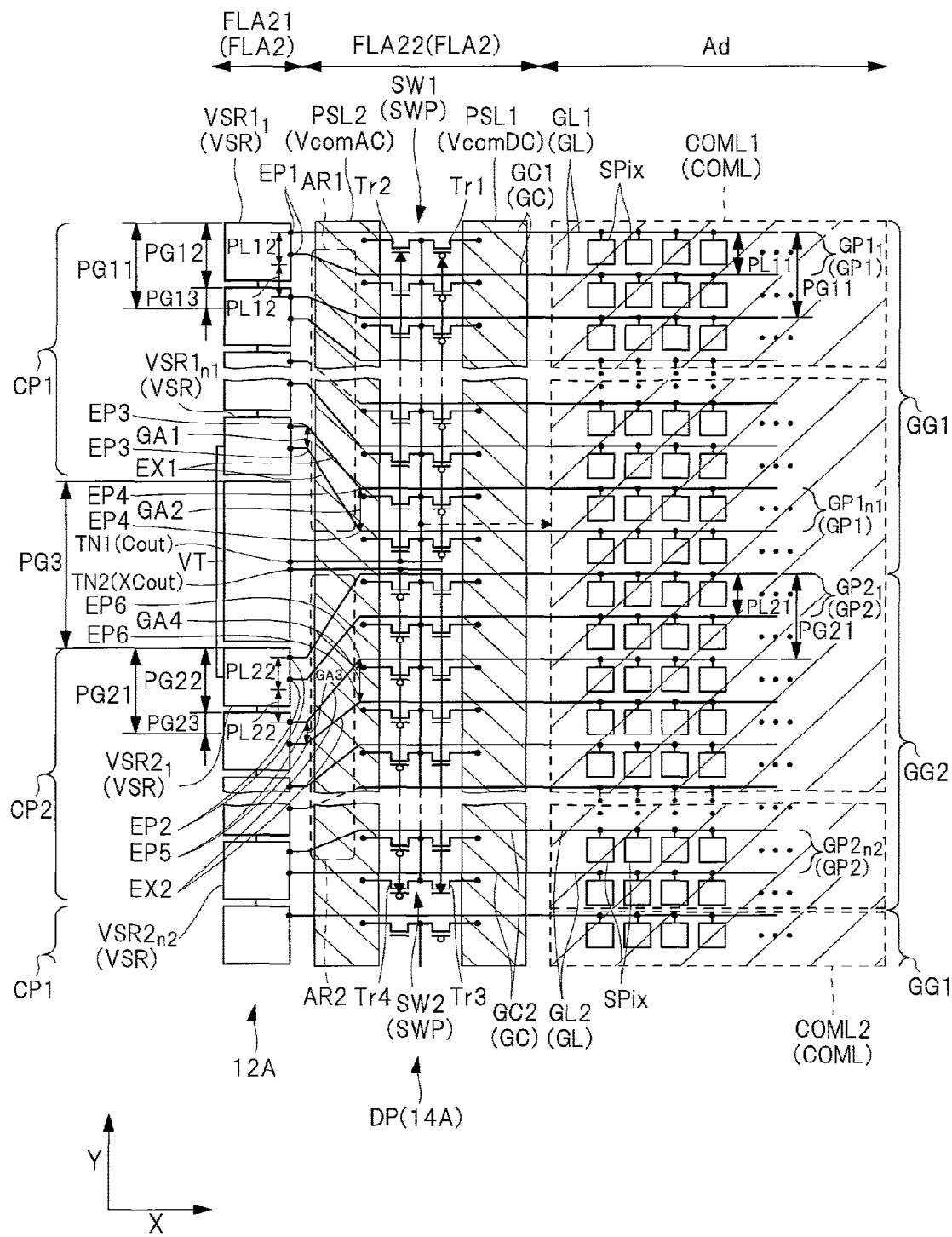
FIG. 9 is a diagram illustrating a configuration of a gate driver and a driving electrode driver in the display apparatus according to the first embodiment.
Figure 10:
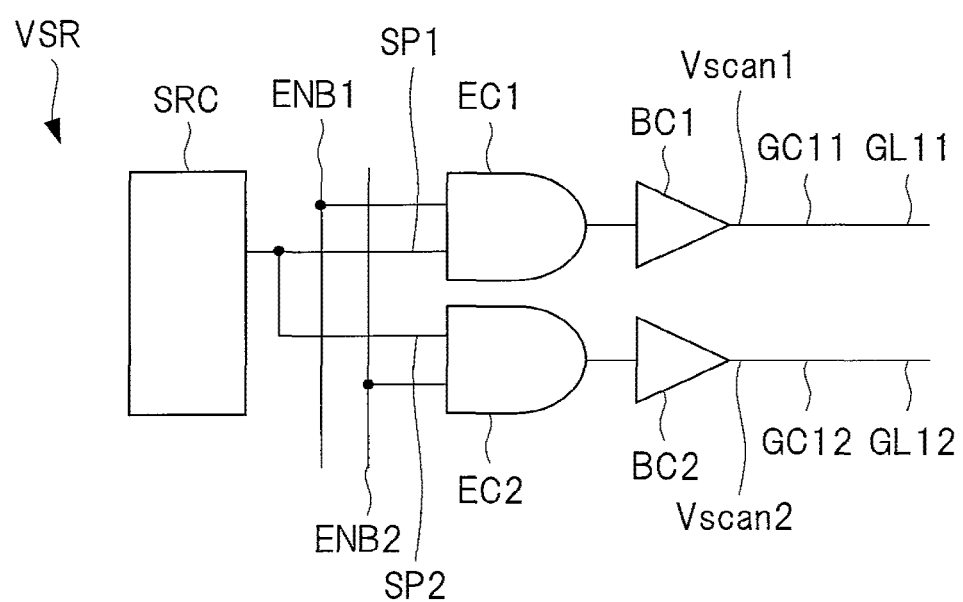
FIG. 10 is a circuit diagram illustrating a transfer circuit included in the gate driver in the display apparatus according to the first embodiment.
Figure 11:
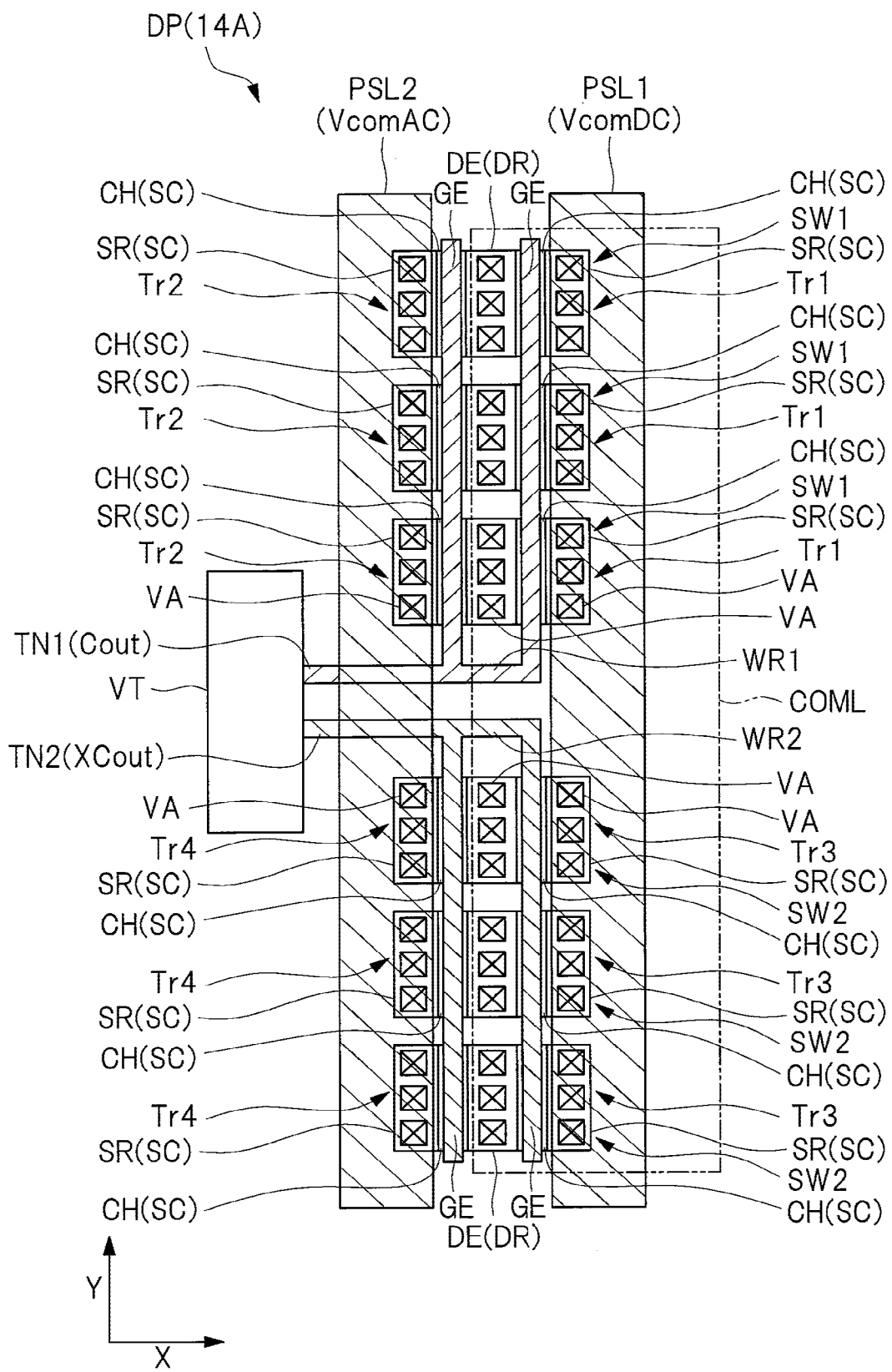
FIG. 11 is a plan view of a transistor included in the driving electrode driver in the display apparatus according to the first embodiment.

Next, with reference to FIG. 4 and FIGS. 9 to 11, a configuration of a gate driver and a driving electrode driver will be described. FIG. 9 is a diagram illustrating a configuration of a gate driver and a driving electrode driver in the display apparatus 1 according to the first embodiment. FIG. 10 is a circuit diagram illustrating a transfer circuit included in the gate driver in the display apparatus according to the first embodiment. FIG. 11 is a plan view of a transistor included in the driving electrode driver in the display apparatus according to the first embodiment.

In the following example, a configuration in the vicinity of a driving electrode COML1 and a driving electrode COML2 serving as one driving electrode COML will be described. Note that FIG. 9 illustrates a configuration of the gate driver 12A and the driving electrode driver 14A, which is the same as a configuration of the gate driver 12B and the driving electrode driver 14B (see FIG. 4) except that the gate driver and the driving electrode driver are symmetrically provided with each other across an axis parallel to the Y-axis direction.

As illustrated in FIG. 9, the gate driver 12A includes a transfer circuit VSR, and sequentially selects one horizontal line of the plurality of sub-pixels SPix provided in the display region Ad. The gate driver 12A is a circuit to which a scanning signal to be fed to the plurality of sub-pixels SPix is input.

As illustrated in FIG. 9, the gate driver 12A includes partial circuit CP1 and CP2. The partial circuit CP2 is spaced apart from the partial circuit CP1 on the negative side out of the partial circuit CP1 in the Y-axis direction. The partial circuit CP1 includes n1 (n1 is an integer equal to or larger than 2) transfer circuits VSR1 serving as circuit units arranged in the Y-axis direction when seen in a plan view. The partial circuit CP2 includes n2 (n2 is an integer equal to or larger than 2) transfer circuits VSR2 serving as circuit units arranged in the Y-axis direction.

That is, the partial circuit CP1 is provided in a partial region of a frame region FLA2, the region being a region FLA21 serving as a partial region positioned on the opposite side of the display region Ad, and extends in the Y-axis direction when seen in a plan view. The partial circuit CP2 is provided in the region FLA21, and extends in the Y-axis direction when seen in a plan view.

In FIG. 9, the first transfer circuit VSR1 is indicated as a transfer circuit $VSR1_1$, and the n1-th transfer circuit VSR1 is indicated as a transfer circuit $VSR1_{n_1}$ as counted from the positive side to the negative side in the Y-axis direction. The first transfer circuit VSR2 is indicated as a transfer circuit $VSR2_1$, and the n2-th transfer circuit VSR2 is indicated as a transfer circuit $VSR2_{n_2}$ counted from the positive side to the negative side in the Y-axis direction.

As a scanning signal line group formed of scanning signal lines GL that overlap the driving electrodes COML when seen in a plan view, scanning signal line groups GG1 and GG2 are provided.

The scanning signal line group GG1 includes n1 (n1 is an integer equal to or larger than 2) partial groups GP1 each formed of m1 (m1 is an integer equal to or larger than 2) scanning signal lines GL arranged in the Y-axis direction. That is, the total number of scanning signal lines GL1 serving as the scanning signal lines GL included in the scanning signal line group GG1 is expressed as "m1×n1" that is the product of m1 and n1. FIG. 9 illustrates an example in which m1 is equal to 2.

The scanning signal line group GG2 includes n2 (n2 is an integer equal to or larger than 2) partial groups GP2 each formed of m2 (m2 is an integer equal to or larger than 2) scanning signal lines GL arranged in the Y-axis direction. That is, the total number of scanning signal lines GL2 serving as the scanning signal lines GL included in the scanning signal line group GG2 is expressed as "m2×n2" that is the product of m2 and n2. Note that FIG. 9 illustrates an example in which m2 is equal to 2.

Each of the scanning signal lines GL2 included in the partial group GP2 is also arranged on the negative side out of all the scanning signal lines GL1 included in the partial group GP1 in the Y-axis direction.

FIG. 9 illustrates the first partial group GP1 as a partial group $GP1_1$, and the n1-th partial group GP1 as a partial group $GP1_{n1}$ as counted from the positive side to the negative side in the Y-axis direction. FIG. 9 illustrates the first partial group GP2 as a partial group $GP2_1$, and the n2-th partial group GP2 as a partial group $GP2_{n2}$ as counted from the positive side to the negative side in the Y-axis direction.

Each of the n1 transfer circuits VSR1 is connected to each of the n1 partial groups, and each of the n2 transfer circuits VSR2 is connected to each of the n2 partial groups GP2. That is, each of the n1 transfer circuits VSR1 is connected to each of the m1 scanning signal lines GL1 included in each of the n1 partial groups GP1, and each of the n2 transfer circuits VSR2 is connected to each of the m2 scanning signal lines GL2 included in each of the n2 partial groups GP2.

Therefore, the m1×n1 scanning signal lines GL1 included in the scanning signal line group GG1 electrically connect the plurality of sub-pixels SPix and the partial circuit CP1 to each other, and the m2×n2 scanning signal lines GL2 included in the scanning signal line group GG2 electrically connect the plurality of sub-pixels SPix and the partial circuit CP2. The partial circuit CP1 and each of the m1×n1 scanning signal lines GL1 are electrically connected to each other by the m1×n1 scanning signal connection wirings GC1, and the partial circuit CP2 and each of the m2×n2 scanning signal lines GL2 are electrically connected to each other by the m2×n2 scanning signal connection wirings GC2. The driving electrode COML1 overlaps the plurality of sub-pixels SPix connected to the m1×n1 scanning signal lines GL1 and the plurality of sub-pixels SPix connected to the m2×n2 scanning signal lines GL2 when seen in a plan view.

That is, the number of the plurality of scanning signal connection wirings GC1 each of which connects the partial circuit CP1 and each of the plurality of scanning signal lines GL1 is the same as the number of the plurality of scanning signal lines GL1. The number of the plurality of scanning signal connection wirings GC2 each of which connects the partial circuit CP2 and each of the plurality of scanning signal lines GL2 is the same as the number of the plurality of scanning signal lines GL2.

In an example illustrated in FIG. 10, one transfer circuit VSR includes, for example, a shift register (S/R) SRC, enable (ENB Cut) circuits EC1 and EC2, and buffer circuits BC1 and BC2. A selection pulse SP1 from the shift register SRC is input to one input terminal of two input terminals of the enable circuit EC1, and an enable signal EMB1 is input to the other input terminal thereof. A selection pulse SP2 from the shift register SRC is input to one input terminal of two input terminals of the enable circuit EC2, and an enable signal EMB2 is input to the other input terminal of the enable circuit EC2. An output of the enable circuit EC1 is input to the buffer circuit BC1, and an output of the enable circuit EC2 is input to the buffer circuit BC2. A scanning signal line GL11 is connected to the output side of the buffer circuit BC1 via a scanning signal connection wiring GC11, and a scanning signal line GL12 is connected to the output side of the buffer circuit BC2 via a scanning signal connection wiring GC12.

The shift register SRC included in each of the transfer circuits VSR starts to operate in response to the above-described vertical start pulse VST (see FIG. 6) so that the selection pulse SP1 is output to the enable circuit EC1, and the selection pulse SP2 is output to the enable circuit EC2 in synchronization with a clock signal fed by a clock line (not illustrated).

Note that the shift register SRC included in a certain transfer circuit VSR generates a transfer pulse (not illustrated) for operating a shift register SRC included in the transfer circuit VSR on a next stage, and transmits the generated transfer pulse to the shift register SRC included in the transfer circuit VSR on the next stage.

The output of the enable circuit EC1 is set to an active level (a selective potential) when both the selection pulse SP1 and the enable signal ENB1 to be input to the enable circuit EC1 are set to the active level. And, the output of the enable circuit EC1 is set to a non-active level (a non-selective potential) when either one of the selection pulse SP1 and the enable signal ENB1 to be input to the enable circuit EC1 is set to the non-active level.

The output of the enable circuit EC2 is set to an active level (a selective potential) when both the selection pulse SP2 and the enable signal ENB2 to be input to the enable circuit EC2 are set to the active level. The output of the enable circuit EC2 is set to a non-active level (a non-selective potential) when either one of the selection pulse SP2 and the enable signal ENB2 to be input to the enable circuit EC2 is set to the non-active level.

The buffer circuit BC1 receives the input from the enable circuit Ed, and then, feeds a scanning signal Vscan1 to the scanning signal line GL11 via the scanning signal connection wiring GC1. The buffer circuit BC2 receives the input from the enable circuit EC2, and then, feeds a scanning signal Vscan2 to the scanning signal line GL12 via the scanning signal connection wiring GC12. As described above, one transfer circuit VSR sequentially selectively feeds the scanning signals to, for example, the m1 scanning signal lines GL1 (two scanning signal lines GL11 and GL12 in FIG. 10) included in the partial group GP1. When a transfer pulse (not illustrated) is transferred from a certain transfer circuit VSR to the transfer circuit VSR on the next stage, and the n1 transfer circuits VSR sequentially operate, so that the scanning signals are sequentially selectively fed to the m1×n1 scanning signal lines GL1 included in the scanning signal line group GG1.

Furthermore, the scanning signals are sequentially selectively fed to the m1×n1 scanning signal lines GL1 included in the scanning signal line group GG1, and then, the scanning signals are sequentially selectively fed to the m1×n1 scanning signal lines GL2 included in the scanning signal line group GG2.

As illustrated in FIG. 9, the n1 partial groups GP1 are arranged with a pitch PG11 in the Y-axis direction, and the n1 transfer circuits VSR1 are arranged with a pitch PG12 in the Y-axis direction. The n2 partial groups GP2 are arranged with a pitch PG21 in the Y-axis direction, and the n2 transfer circuits VSR2 are arranged with a pitch PG22 in the Y-axis direction. The pitch PG12 is narrower than the pitch PG11, and the pitch PG22 is narrower than the pitch PG21.

The pitch PG11 is an integral multiple (m1 times) of a pitch PL11 between the scanning signal lines GL1, i.e., of a pixel pitch in the Y-axis direction, and the pitch PG21 is an integral multiple (m2 times) of a pitch PL21 between the scanning signal lines GL2, i.e., of a pixel pitch in the Y-axis direction. The n1 transfer circuits VSR1 are arranged with a pitch PG12 narrower than the pitch PG11, and the n2 transfer circuit VSR2 are arranged with a pitch PG22 narrower than the pitch PG21.

Thus, the partial circuit CP2 formed of the n2 transfer circuits VSR2 can be spaced apart from the partial circuit CP1 formed of the n1 transfer circuits VSR1. Therefore, a circuit different from the partial circuits CP1 and CP2 can be arranged between the partial circuit CP1 and the partial circuit CP2, and the width of the frame region FLA2 in the X-axis direction can be decreased.

That is, in the first embodiment, the partial circuit CP2 is arranged on the negative side out of the partial circuit CP1 in the Y-axis direction so as to be spaced apart from the partial circuit CP1 as illustrated in FIG. 9.

It is assumed that the pitch PG12 is narrower by a pitch PG13 than the pitch PG11, and the pitch PG22 is narrower by a pitch PG23 than the pitch PG21. At this time, the partial circuit CP2 can be spaced apart from the partial circuit CP1 by a distance PG3 equal to the sum of PG13×n1 and PG23×n2.

Alternatively, the arrangement in the first embodiment can be restated as follows.

The m1×n1 scanning signal lines GL1 are provided in the display region Ad, and each of them extends in the X-axis direction and is arranged with the pitch PL11 in the Y-axis direction when seen in a plan view. The m2×n2 scanning signal lines GL2 are provided in the display region Ad, and each of them extends in the X-axis direction and is arranged with the pitch PL21 in the Y-axis direction when seen in a plan view. Each of the m2×n2 scanning signal lines GL2 is arranged on the negative side out of all of the m1×n1 scanning signal lines GL1 in the Y-axis direction when seen in a plan view.

Each of the m1×n1 scanning signal connection wirings GC1 includes an end EP1 on the negative side in the X-axis direction, and the m1×n1 ends EP1 respectively included in the m1×n1 scanning signal connection wirings GC1 are connected to the partial circuit CP1, and are arranged in the Y-axis direction when seen in a plan view. Each of the m2×n2 scanning signal connection wirings GC2 includes an end EP2 on the negative side in the X-axis direction, and the m2×n2 ends EP2 respectively included in the m2×n2 scanning signal connection wirings GC2 are connected to the partial circuit CP2, and are arranged in the Y-axis direction when seen in a plan view.

At this time, a pitch PL12 which is an average pitch in the Y-axis direction in an arrangement of the m1×n1 ends EP1 is narrower than the pitch PL11. A pitch PL22 which is an average pitch in the Y-axis direction in an arrangement of the m2×n2 ends EP2 is narrower than the pitch PL21.

The average pitch in the Y-axis direction in the arrangement of the m1×n1 ends EP1 means, for example, a length obtained by dividing a distance in the Y-axis direction between the respective centers of the ends EP1 arranged at both ends of an arrangement of the continuously-arranged (m1+1) ends EP1 by m1. That is, the average pitch in the Y-axis direction in the arrangement of the m1×n1 ends EP1 is an average value of distances in the Y-axis direction between the respective centers of the adjacent ends EP1 in the arrangement of the m1×n1 ends EP1. Therefore, the distance in the Y-axis direction between the respective centers of the two adjacent ends EP1 is smaller than the pitch PL11.

The average pitch in the Y-axis direction in the arrangement of the m2×n2 ends EP2 means, for example, a length obtained by dividing a distance in the Y-axis direction between the respective centers of the ends EP2 arranged at both ends of an arrangement of the continuously-arranged (m2+1) ends EP2 by m2. That is, the average pitch in the Y-axis direction in the arrangement of the m2×n2 ends EP2 is an average value of distances in the Y-axis direction between the respective centers of the adjacent ends EP2 in the arrangement of the m2×n2 ends EP2. Therefore, the distance in the Y-axis direction between the respective centers of any two adjacent ends EP2 is smaller than the pitch PL21.

In this manner, as described above, the partial circuit CP2 formed of the n2 transfer circuits VSR2 can be spaced apart from the partial circuit CP1 formed of the n1 transfer circuits VSR1. Therefore, a circuit different from the partial circuits CP1 and CP2 can be arranged between the partial circuit CP1 and the partial circuit CP2, and the width of the frame region FLA2 in the X-axis direction can be decreased.

Note that the pitch PL21 can be made equal to the pitch PL11, and the pitch PL22 can be made equal to the pitch PL12.

Preferably, any one of the m1×n1 scanning signal connection wirings GC1 includes an extension portion EX1 extending in a direction different from the X-axis direction, and any one of the m2×n2 scanning signal correction wirings GC2 includes an extension portion EX2 extending in a direction different from the X-axis direction.

The extension portion EX1 overlaps a power supply wiring PSL2 when seen in a plan view, and the extension portion EX2 overlaps the power supply wiring PSL2 when seen in a plan view. In other words, the m1×n1 scanning signal connection wirings GC1 expand, i.e., fan out in a region AR1 where the extending portion EX1 and the power supply wiring PSL2 overlap each other when seen in a plan view so that a distance in the Y-axis direction between the adjacent scanning signal connection wirings GC1 becomes larger as being closer to the positive side in the X-axis direction. The m2×n2 scanning signal connection wirings GC2 fan out in a region AR2 where the extending portion EX2 and the power supply wiring PSL2 overlap each other when seen in a plan view so that a distance in the Y-axis direction between the adjacent scanning signal connection wirings GC2 becomes larger as being closer to the positive side in the X-axis direction.

That is, each of the two adjacent scanning signal connection wirings GC1 of the m1×n1 scanning signal connection wirings GC1 includes the extension portion EX1, and each of the two adjacent scanning signal connection wirings GC2 of the m2×n2 scanning signal connection wirings GC2 includes the extension portion EX2. A distance GA1 in the Y-axis direction between the respective centers of ends EP3 on the transfer circuit VSR side of the two extension portions EX1 respectively included in the two scanning signal connection wirings GC1 is smaller than a distance GA2 in the Y-axis direction between the respective centers of ends EP4 on the opposite side of the transfer circuit VSR side of the two extension portions EX1. A distance GA3 in the Y-axis direction between the respective centers of ends EP5 on the transfer circuit VSR side of the two extension portions EX2 respectively included in the two scanning signal connection wirings GC2 is smaller than a distance GA4 in the Y-axis direction between the respective centers of ends EP6 on the opposite side of the transfer circuit VSR side of the two extension portions EX2.

The width in the X-axis direction of the power supply wiring PSL2 for feeding the detection driving signal VcomAC is equal to or larger than the width in the X-axis direction of the power supply wiring PSL1 for feeding the display driving signal VcomDC, and the width in the X-axis direction of the power supply wiring PSL2 for feeding the detection driving signal VcomAC is sufficiently large. Therefore, when the extension portion EX1 overlaps the power supply wiring PSL2 when seen in a plan view, the m1×n1 scanning signal connection wirings GC1 can be easily arranged to fan out without increasing the width in the X-axis direction of the frame region FLA2. Also, when the extension portion EX2 overlaps the power supply wiring PSL2 when seen in a plan view, the m2×n2 scanning signal connection wirings GC2 can be easily arranged to fan out without increasing the width in the X-axis direction of the frame region FLA2.

When the pitch PL12 is shorter than the pitch PL11, and the pitch PL22 is shorter than the pitch PL21 as described above, it is required to arrange a part of the scanning signal connection wiring GC so as to extend in a direction different from the X-axis direction in which the scanning signal lines GL extend. However, the arrangement of the scanning signal connection wirings GC is complicated, and therefore, it is not easy to arrange the scanning signal connection wirings GC so that the pitch PL12 is shorter than the pitch PL11 and the pitch PL22 is shorter than the pitch PL21.

However, by the arrangement of the extension portion EX1 and the extension portion EX2 so as to overlap the power supply wiring PSL2 when seen in a plan view, it is easy to arrange the scanning signal connection wirings GC so that the pitch PL12 is shorter than the pitch PL11 and the pitch PL22 is shorter than the pitch PL21.

The driving electrode driver 14A includes a driving unit DP. The driving unit DP is a circuit that switches the display driving signal VcomDC and the detection driving signal VcomAC based on a driving electrode selection signal fed from, for example, a scanning control unit (not illustrated) included in the COG 19, and that feeds the display or detection driving signal to the driving electrode COML. The driving unit DP is provided on a one-on-one basis with respect to, for example, the driving electrode COML, and applies the display driving signal VcomDC or the detection driving signal VcomAC to the corresponding driving electrode COML.

The driving unit DP includes a driving circuit VT, the power supply wirings PSL1 and PSL2, and a switching unit SWP.

The driving circuit VT includes a shift register and a buffer circuit as similar to, for example, the transfer circuit VSR described with reference to FIG. 10, and switches the display driving signal VcomDC and the detection driving signal VcomAC and feeds the display or detection driving signal to the driving electrode COML. The driving circuit VT includes a terminal TN1 serving as a feeding unit that feeds an alternate-current signal Cout and a terminal TN2 serving as a feeding unit that feeds an alternate-current signal XCout having an opposite phase to that of the alternate-current signal Cout. The driving circuit VT is arranged between the partial circuit CP1 and the partial circuit CP2.

The power supply wiring PSL1 is provided in a region FLA22 which is a partial region of the frame region FL2, the partial region being positioned on the display region Ad side out of the region FLA21, and extends in the Y-axis direction when seen in a plan view. The power supply wiring PSL2 is provided in the region FLA22, and extends in the Y-axis direction and is arranged on the negative side out of the power supply wiring PSL1 in the X-axis direction when seen in a plan view.

The switching unit SWP is provided in the region FLA22, and extends in the Y-axis direction and is arranged between the power supply wiring PSL1 and the power supply wiring PSL2 when seen in a plan view. The switching unit SWP switches the power supply wiring PSL1 and the power supply wiring PSL2 and connects the power supply wiring PSL1 or PSL2 to the driving electrode COML. That is, the driving circuit VT switches the power supply wiring PSL1 and the power supply wiring PSL2 and connects the power supply wiring PSL1 or PSL2 to the driving electrode COML by using the switching unit SWP so as to switch the display driving signal VcomDC and the detection driving signal VcomAC and feed the display or detection driving signal to the driving electrode COML.

The touch detection unit 40 (see FIG. 4) detects an input position when the detection driving signal VcomAC is fed to the driving electrode COML. The plurality of sub-pixels SPix connected to the m1×n1 scanning signal lines GL1 and the plurality of sub-pixels SPix connected to the m2×n2 scanning signal lines GL2 display an image when the display driving signal VcomDC is fed to the driving electrode COML.

The switching unit SWP includes a plurality of switching elements SW1 and a plurality of switching elements SW2.

The plurality of switching elements SW1 are arranged in the Y-axis direction when seen in a plan view, and the plurality of switching elements SW2 are arranged in the Y-axis direction when seen in a plan view. Each of the plurality of switching elements SW2 is arranged on the negative side out of all of the plurality of switching elements SW1 in the Y-axis direction.

As illustrated in FIG. 9, each of the plurality of switching elements SW1 preferably includes a transistor Tr1 serving as a p-channel field effect transistor and a transistor Tr2 serving as an n-channel field effect transistor. That is, a conductivity type of a carrier in an on-state of the transistor Tr1 is a p-type, and a conductivity type of a carrier in an on-state of the transistor Tr2 is an n-type. Each of the transistors Tr1 and Tr2 is a thin film transistor.

Here, a configuration of the transistor Tr1 will be described as a representative of the transistors Tr1 and Tr2 (the same goes for a configuration of transistors Tr3 and Tr4 described below).

As illustrated in FIG. 11, the transistor Tr1 is, for example, a thin film transistor of a top gate type, and includes a semiconductor layer SC, a gate insulating film (not illustrated), a gate electrode GE, a source region SR, and a drain region DR.

The semiconductor layer Sc is made of, for example, amorphous silicon, polycrystalline silicon (polysilicon), or others. A portion of the semiconductor layer Sc, which overlaps the gate electrode GE when seen in a plan view, is a channel region CH. A portion of the semiconductor layer Sc, which is arranged on one side out of the gate electrode GE, is the source region SR. A portion of the semiconductor layer Sc, which is arranged on the other side out of the gate electrode GE, is the drain region DR.

The gate electrode GE is provided on the channel region CH through the gate insulating film (not illustrated). The gate insulating film is a transparent insulating film made of, for example, silicon nitride, silicon oxide, or others. The gate electrode GE is made of a metal such as aluminum (Al) or molybdenum (Mo).

Note that the transistor Tr1 may be a thin film transistor of a so-called bottom gate type, and the gate electrode GE may be provided below the channel region CH through the gate insulating film.

A transparent insulating film (not illustrated) made of, for example, silicon nitride, silicon oxide, or others, is provided to cover the source region SR, the drain region DR, and the gate electrode GE. A via VA, which reaches the source region SR, the drain region DR, or the gate electrode GE, is formed so as to penetrate through the insulating film. The source region SR is electrically connected to the power supply wiring PSL1 or PSL2 via the via VA, the drain region DR is electrically connected to the drain electrode DE via the via VA. Each of the power supply wirings PSL1 and PSL2 and the drain electrode DE is made of a non-transparent metal such as aluminum (Al) or molybdenum (Mo). The drain electrode DR is further connected to the driving electrode COML through a via (not illustrated) in an upper layer. Note that the source region SR and the drain region DR may be replaced with each other.

The transistor Tr2 included in a certain switching element SW1 is connected in series with the transistor Tr1 included in the switching element SW1. A portion of the transistor Tr1 on the transistor Tr2 side is connected to the driving electrode COML, a portion of the transistor Tr1 on the opposite side of the transistor Tr2 side is connected to the power supply wiring PSL1, and a portion of the transistor Tr2 on the opposite side of the transistor Tr1 side is connected to the power supply wiring PSL2. That is, each of the plurality of switching elements SW1 is a CMOS (Complementary Metal Oxide Semiconductor) formed of the p-channel transistor Tr1 and the n-channel transistor Tr2 that are connected in series with each other.

As illustrated in FIG. 9, each of the plurality of switching elements SW2 preferably includes a transistor Tr3 serving as an n-channel field effect transistor and a transistor Tr4 serving as a p-channel field effect transistor. That is, a conductivity type of a carrier in an on-state of the transistor Tr3 is an n-type, and a conductivity type of a carrier in an on-state of the transistor Tr4 is a p-type. Each of the transistors Tr3 and Tr4 is a thin film transistor.

The transistor Tr4 included in a certain switching element SW2 is connected in series with the transistor Tr3 included in the switching element SW2. A portion of the transistor Tr3 on the transistor Tr4 side is connected to the driving electrode COML, a portion of the transistor Tr3 on the opposite side of the transistor Tr4 side is connected to the power supply wiring PSL1, and a portion of the transistor Tr4 on the opposite side of the transistor Tr3 side is connected to the power supply wiring PSL2. That is, each of the plurality of switching elements SW2 is a CMOS formed of the n-channel transistor Tr3 and the p-channel transistor Tr4 that are connected in series with each other.

When the switching element SW1 is formed of the CMOS as described above, it is not required to intersect connection wirings WR1 and WR2 for connecting the switching element SW1 and the terminals TN1 and TN2 of the driving circuit with the power supply wiring PSL2 for each switching element SW1 as described below with reference to FIG. 15. Therefore, the parasitic capacitances between the connection wirings WR1 and WR2 and the power supply wiring PSL2 can be decreased.

And, when the switching element 5W2 is formed of the CMOS, it is not required to intersect connection wirings WR1 and WR2 for connecting the switching element SW2 and the terminals TN1 and TN2 of the driving circuit with the power supply wiring PSL2 for each switching element SW2 as described below with reference to FIG. 15. Therefore, the parasitic capacitances between the connection wirings WR1 and WR2 and the power supply wiring PSL2 can be decreased.

A gate electrode of the transistor Tr1 included in each of the plurality of switching elements SW1 and a gate electrode of the transistor Tr2 included in each of the plurality of switching elements SW1 are connected to the terminal TN1. A gate electrode of the transistor Tr3 included in each of the plurality of switching elements SW2 and a gate electrode of the transistor Tr4 included in each of the plurality of switching elements SW2 are connected to the terminal TN2.

Therefore, a connection wiring for connecting the gate electrode GE of a certain transistor Tr1 and the terminal TN1 is included in each of the plurality of transistors Tr1 arranged on the terminal TN1 side out of the transistor Tr1, and is formed a plurality of gate electrodes GE connected in series with one another. A connection wiring for connecting the gate electrode GE of a certain transistor Tr2 and the terminal TN1 is included in each of the plurality of transistors Tr2 arranged on the terminal TN1 side out of the transistor Tr2, and is formed of a plurality of gate electrodes GE connected in series with one another.

Also, a connection wiring for connecting the gate electrode GE of a certain transistor Tr3 and the terminal TN2 is included in each of the plurality of transistors Tr3 arranged on the terminal TN2 side out of the transistor Tr3, and is formed a plurality of gate electrodes GE connected in series with one another. A connection wiring for connecting the gate electrode GE of a certain transistor Tr4 and the terminal TN2 is included in each of the plurality of transistors Tr4 arranged on the terminal TN2 side out of the transistor Tr4, and is formed of a plurality of gate electrodes GE connected in series with one another.

Preferably, the number of the scanning signal lines GL1 connected to the one transfer circuit VSR1 and the number of the scanning signal lines GL2 connected to the one transfer circuit VSR2 are equal to each other, and the number of the transfer circuits VSR1 included in the partial circuit CP1 and the number of the transfer circuits VSR2 included in the partial circuit CP2 are equal to each other. In other words, the driving circuit VT is inserted and arranged at the center of an arrangement of "2×n1" transfer circuits VSR formed of "n1" transfer circuits VSR1 included in the partial circuit CP1 and "n2", in other words, "n1" transfer circuits VSR2 included in the partial circuit CP2. In other words, the driving circuit VT serving as a circuit for touch detection is inserted and arranged in the middle of the arrangement of the transfer circuits VSR.

Thus, it is not required to provide a connection wiring extending along the power supply wiring PSL2 in a region between the region FLA21 and the region FLA22, so that the length of the connection wiring can be decreased.

Alternatively, it is not required to set the number of the transfer circuits VSR1 included in the partial circuit CP1 and the number of the transfer circuits VSR2 included in the partial circuit CP2 so as to be equal to each other. However, a difference in the number therebetween is preferably, for example, about one or less.

Alternatively, a plurality of driving circuits VT may be inserted and arranged at a plurality of positions in the middle of the arrangement of the 2×n1 transfer circuits VSR. At this time, the plurality of driving circuits VT may be spaced apart from one another in the Y-axis direction. However, the plurality of driving circuits VT are preferably spaced with a certain pitch in the Y-axis direction.

Note that the driving circuit VT may be arranged at one end of the arrangement of the 2×n1 transfer circuits VSR formed the n1 transfer circuits VSR1 included in the partial circuit CP1 and the n1 transfer circuits VSR2 included in the partial circuit CP2.

<Width in Transverse Direction of Frame Region>

Figure 12:
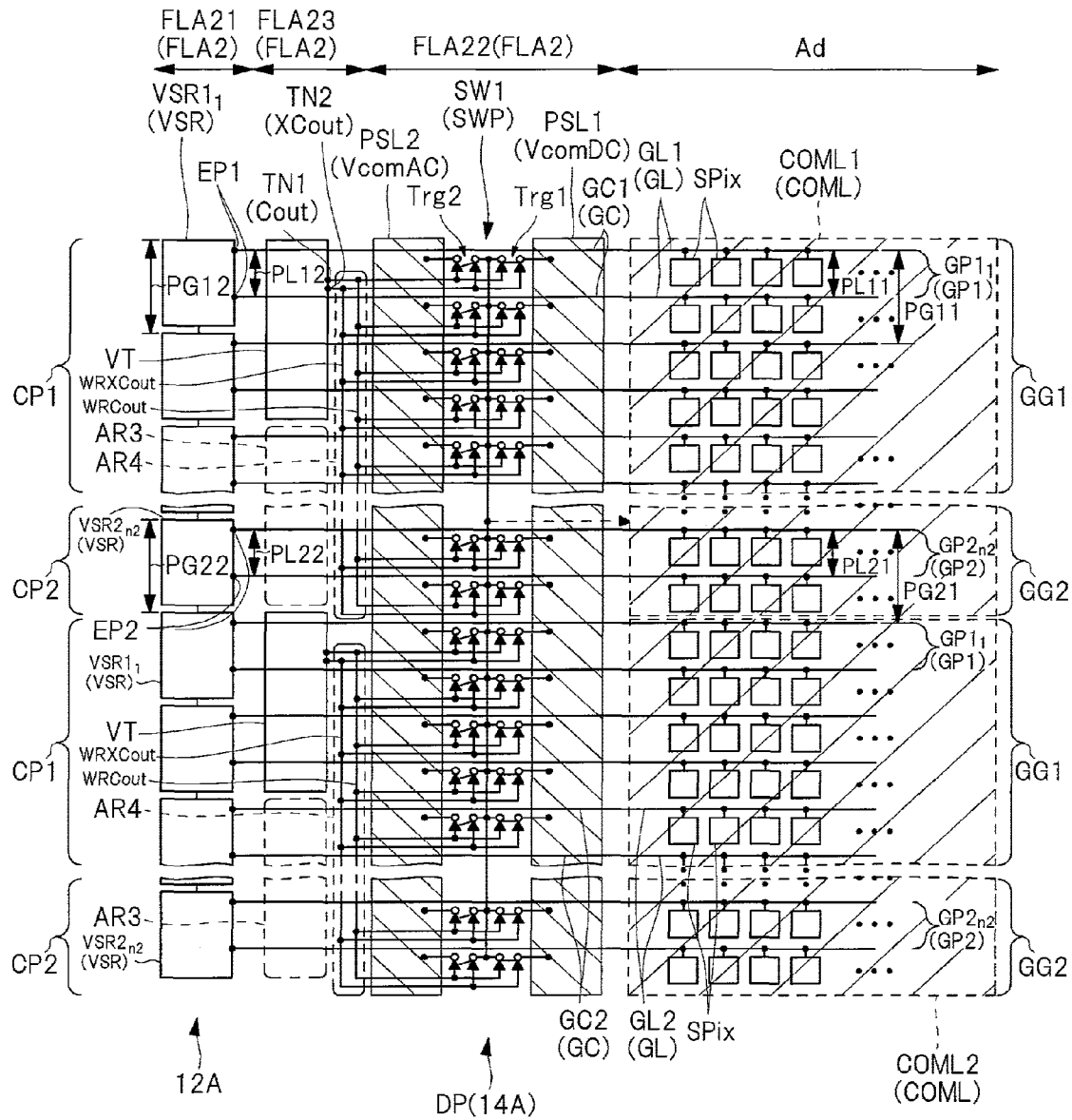
FIG. 12 is a diagram illustrating a configuration of a gate driver and a driving electrode driver in a display apparatus according to a comparative example.
Figure 13:
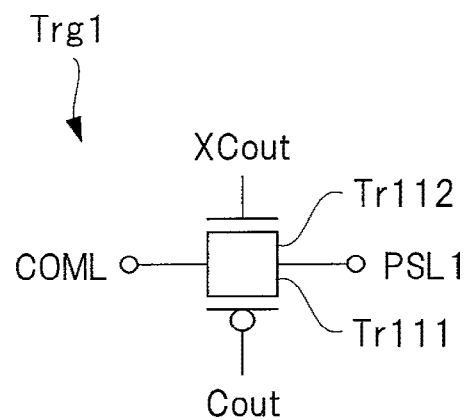
FIG. 13 is a circuit diagram illustrating a part of a switching unit included in the driving electrode driver in the display apparatus according to the comparative example.
Figure 14:
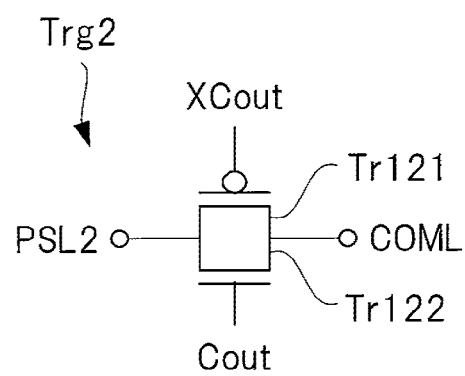
FIG. 14 is a circuit diagram illustrating a part of the switching unit included in the driving electrode driver in the display apparatus according to the comparative example.

Next, a width in a transverse direction (the X-axis direction) of a frame region FLA2 will be described with reference to FIGS. 12 to 15 while being compared with that in a comparative example. FIG. 12 is a diagram illustrating a configuration of a gate driver and a driving electrode driver in a display apparatus in the comparative example. FIGS. 13 and 14 are circuit diagrams each illustrating a part of a switching unit included in the driving electrode driver in the display apparatus in the comparative example. FIG. 15 is a plan view of a transistor in the comparative example.

Also in the comparative example, a gate driver 12A includes partial circuits CP1 and CP2 as similar to the first embodiment. The partial circuit CP2 is arranged on the negative side out of the partial circuit CP1 in a Y-axis direction. The partial circuit CP1 includes n1 (n1 is an integer equal to or larger than 2) transfer circuits VSR1 serving as circuit units arranged in the Y-axis direction when seen in a plan view. The partial circuit CP2 includes n2 (n2 is an integer equal to or larger than 2) transfer circuits VSR2 serving as circuit units arranged in the Y-axis direction when seen in a plan view.

In the comparative example, as illustrated in FIG. 12, n1 partial groups GP1 are arranged with a pitch PG11 in the Y-axis direction, and the n1 transfer circuits VSR1 are arranged with a pitch PG12 in the Y-axis direction. And, the n2 partial groups GP2 are arranged with a pitch PG21 in the Y-axis direction, and the n2 transfer circuits VSR2 are arranged with a pitch PG22 in the Y-axis direction.

Each of m1×n1 scanning signal connection wirings GC1 includes an end EP1 on the negative side in the X-axis direction, and the m1×n1 ends EP1 respectively included in the m1×n1 scanning signal connection wirings GC1 are connected to the partial circuit CP1, and are arranged in the Y-axis direction when seen in a plan view. Each of m2×n2 scanning signal connection wirings GC2 includes an end EP2 on the negative side in the X-axis direction, and the m2×n2 ends EP2 respectively included in the m2×n2 scanning signal connection wirings GC2 are connected to the partial circuit CP2, and are arranged in the Y-axis direction when seen in a plan view.

However, in the comparative example, the partial circuit CP2 is not spaced apart from the partial circuit CP1 as different from the first embodiment. That is, the pitch PG12 is equal to the pitch PG11, and the pitch PG22 is equal to the pitch PG21. In other words, a pitch PL12 serving as an average pitch in the Y-axis direction in an arrangement of the m1×n1 ends EP1 is equal to a pitch PL11 in the Y-axis direction in an arrangement of the m1×n1 scanning signal lines GL1. A pitch PL22 serving as an average pitch in the Y-axis direction in an arrangement of the m2×n2 ends EP2 is equal to a pitch PL21 in the Y-axis direction in an arrangement of the m2×n2 scanning signal lines GL2.

In the comparative example, note that each of the plurality of switching elements SW1 includes a transistor group Trg1 formed of, for example, a p-channel transistor Tr111 and an n-channel transistor Tr112 that are connected in parallel with each other as illustrated in FIG. 13. In the comparative example, each of the plurality of switching elements SW1 includes a transistor group Trg2 formed of, for example, a p-channel transistor Tr121 and an n-channel transistor Tr122 that are connected in parallel with each other as illustrated in FIG. 14. That is, each of the plurality of switching elements SW1 is formed of four field effect transistors.

Each of a gate electrode of the transistor Tr111 and a gate electrode of the transistor Tr122 is connected to a terminal TN1 serving as a feeding unit that feeds an alternate-current signal Cout. Each of a gate electrode of the transistor Tr112 and a gate electrode of the transistor Tr121 is connected to a terminal TN2 serving as a feeding unit that feeds an alternate-current signal XCout.

In the comparative example, the driving circuit VT is provided in a partial region of the frame region FLA2, the partial region being a region FLA23 serving as a region between a region FLA21 and a region FLA22. Therefore, the width of the frame region FLA2 in the X-axis direction is increased by the region FLA23, and therefore, the area of the frame region FLA2 cannot be decreased.

The area of the region where the driving circuit VT is provided is smaller than the area of the region where the partial circuits CP1 and CP2 are provided. Therefore, when the driving circuit VT is provided at a position different from the partial circuits CP1 and CP2 in the X-axis direction as similar to the comparative example, the two driving circuits VT adjacent to each other in the Y-axis direction are spaced apart from each other in the Y-axis direction. Therefore, a vacant region where no circuit is formed in the same layer as a layer having the two driving circuits VT as illustrated in a region AR3 surrounded by a wavy line is provided between the two driving circuits VT, and therefore, the frame region FLA2 cannot be effectively utilized.

In the comparative example, a connection wiring WRCout electrically connected to the terminal TN1 and extending along a power supply wiring PSL2 is provided in a partial region of the frame region FLA2, the partial region being the region FLA23 serving as a region between the region FLA21 and the region FLA22. A connection wiring WRXCout electrically connected to the terminal TN2 and extending along the power supply wiring PSL2 is provided in the region FLA23. Therefore, the width of the frame region FLA2 in the X-axis direction is further increased by a region AR4 where the connection wirings WRCout and WRXCout are provided, and therefore, the area of the frame region FLA2 cannot be decreased.

Figure 15:
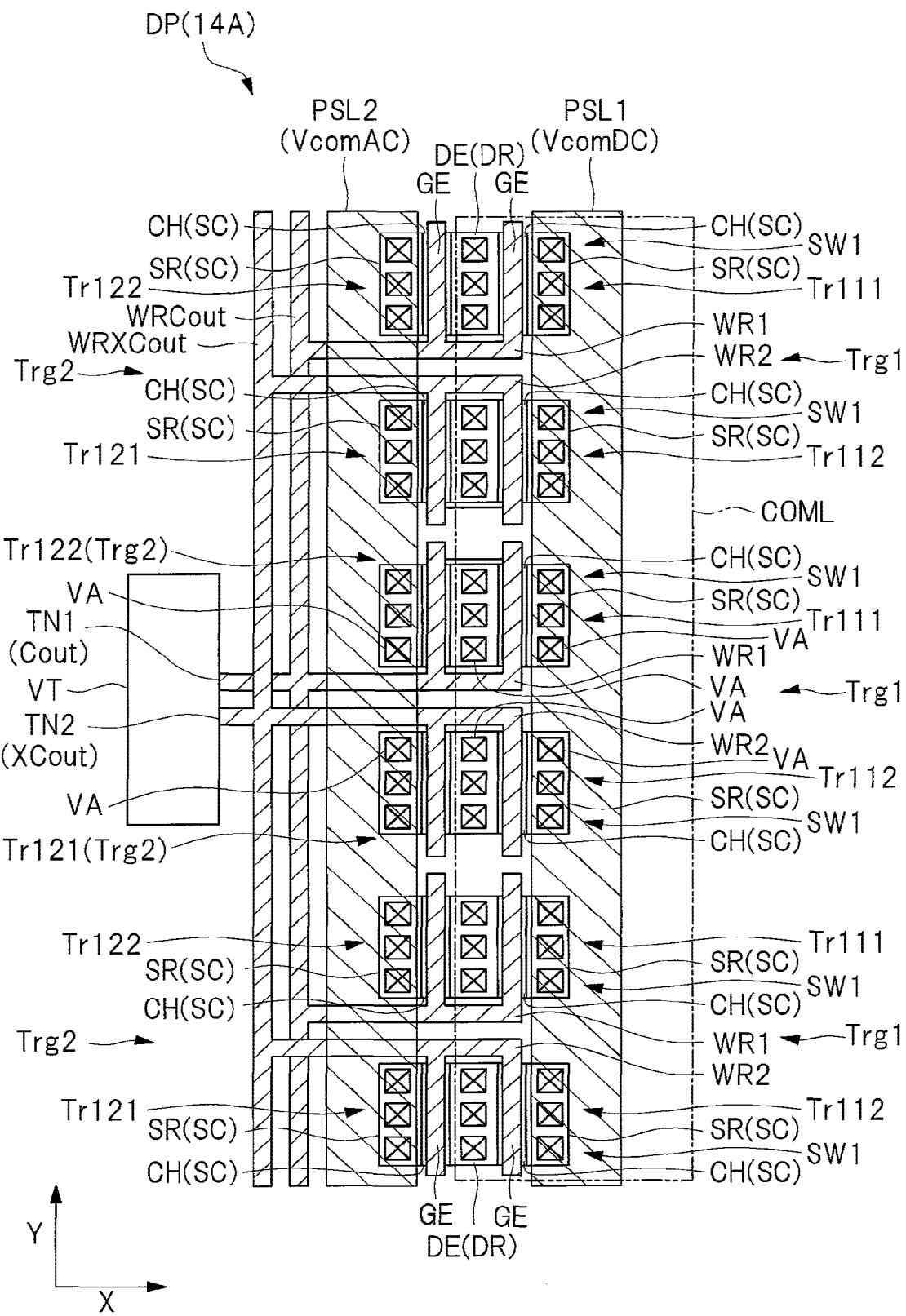
FIG. 15 is a plan view of a transistor in the comparative example

As illustrated in FIGS. 12 and 15, note that the connection wiring WR1 for connecting the connection wiring WRCout and the switching element SW1 intersects the power supply wiring PSL2. The connection wiring WR2 for connecting the connection wiring WRXCout and the switching element SW1 intersects the power supply wiring PSL2.

That is, in the comparative example, the driving circuit VT serving as a circuit different from the transfer circuit VSR included in the gate driver 12A is provided in the frame region FLA2 serving as a region arranged on one side out of a display region Ad in the X-axis direction in which the scanning signal lines GL extend. The driving circuit VT is provided at a position different from the transfer circuit VSR in the X-axis direction.

However, an area ratio of a wiring and an element in the driving circuit VT is smaller than an area ratio of a wiring and an element in the transfer circuit VSR. That is, a distance between the two driving circuits VT adjacent to each other is larger than a distance between the two transfer circuits adjacent to each other. This means that it is only required to provide one driving circuit VT for each of several ten transfer circuits VSR.

Therefore, the region AR3 serving as a vacant region is provided between the two driving circuits VT adjacent to each other. Therefore, the frame region FLA2 cannot be effectively utilized, and the area of the frame region FLA2 cannot be decreased.

On the other hand, in the present first embodiment, the pitch PL12 serving as an average value of the distance in the Y-axis direction between the respective centers of the ends EP1 adjacent to each other in the arrangement of the m1×n1 ends EP1 is narrower than the pitch PL11 between the scanning signal lines GL1. The pitch PL22 serving as an average value of the distance in the Y-axis direction between the respective centers of the ends EP2 adjacent to each other in the arrangement of the m2×n2 ends EP2 is narrower than the pitch PL21 between the scanning signal lines GL2.

Thus, as described above, the partial circuit CP2 formed of the n2 transfer circuits VSR2 can be spaced apart from the partial circuit CP1 formed of the n1 transfer circuits VSR1. Therefore, a circuit different from the partial circuit CP1 and CP2 can be arranged between the partial circuit CP1 and the partial circuit CP2, so that the area of the frame region FLA2 can be decreased.

That is, in the present first embodiment, the driving circuit VT serving as a circuit different from the transfer circuit VSR included in the gate driver 12A is provided in the frame region FLA2 serving as a region arranged on one side out of the display region Ad in the X-axis direction in which the scanning signal lines GL extend. The driving circuit VT is provided at the same position as that of the transfer circuit VSR in the X-axis direction. In other words, the driving circuit VT is arranged between the partial circuit CP1 and the partial circuit CP2.

Thus, no vacant region is provided between the two driving circuits VT adjacent to each other, and therefore, the frame region FLA2 can be effectively utilized, so that the area of the frame region FLA2 can be decreased.

In the comparative example, the width in the X-axis direction of the region FLA23 where the driving circuit VT and the connection wirings WRCout and WRXCout are provided is, for example, about 0.1 mm. In the comparative example, the width of the frame region FLA2 in the X-axis direction is, for example, about 0.5 to 1.0 mm. Meanwhile, in the present first embodiment, the width of the frame region FLA2 in the X-axis direction can be decreased by the width in the X-axis direction of a region where the driving circuit VT and the connection wirings WRCout and WRXCout are provided, and an effect of the decreased width is significant.

In the present first embodiment, the driving circuit VT is not provided at a position different from the partial circuits CP1 and CP2 in the X-axis direction. Therefore, no vacant region is provided between the two driving circuits VT adjacent to each other in the Y-axis direction, and therefore, the frame region FLA2 can be effectively utilized.

In the present first embodiment, the connection wirings WRCout and WRXCout (see FIG. 12) extending along the power supply wiring PSL2 are not provided in a region between the region FLA21 and the region FLA22, and therefore, the area of the frame region FLA2 can be further decreased.

<Modified Example of Display Apparatus>

Figure 16:
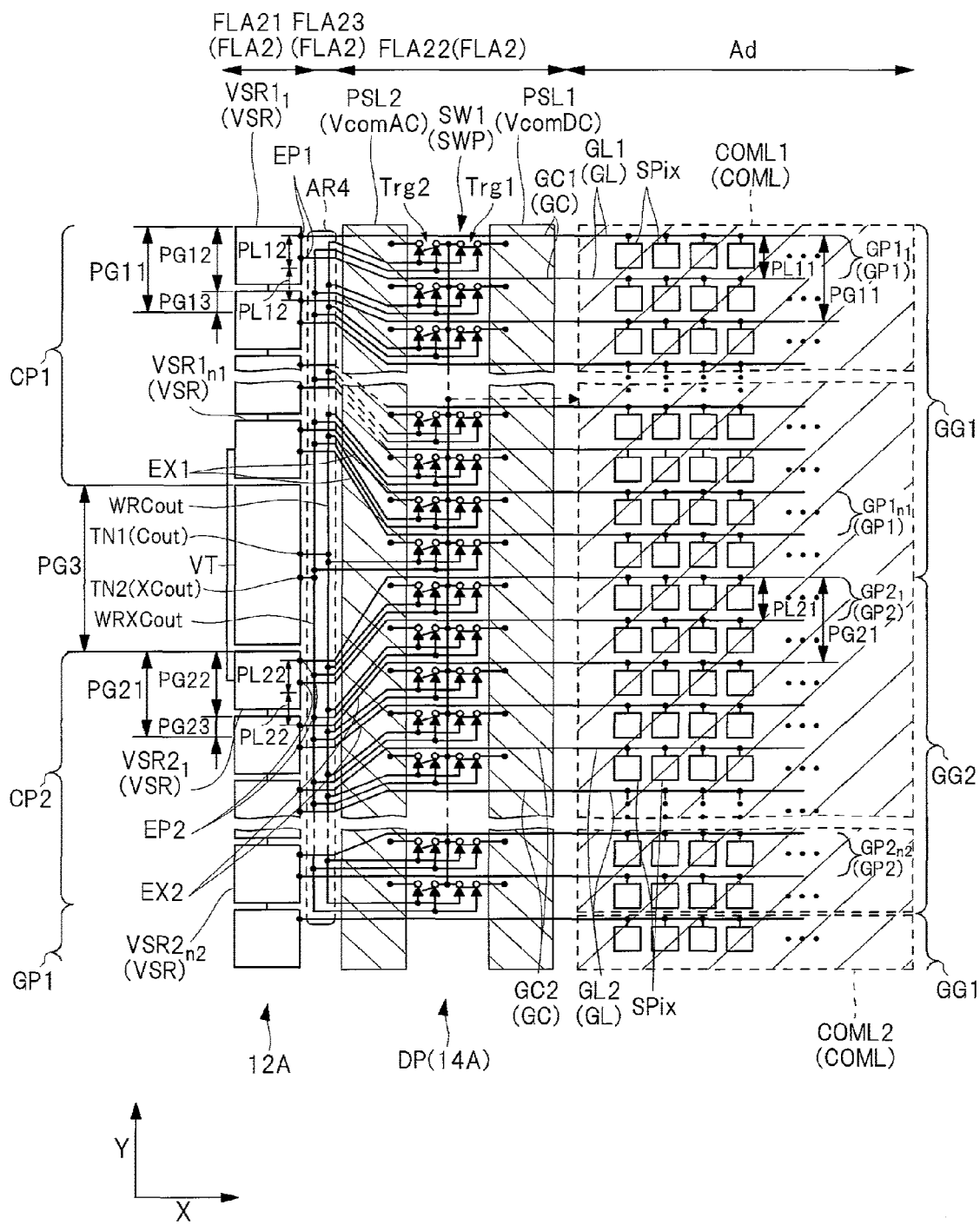
FIG. 16 is a diagram illustrating a configuration of a gate driver and a driving electrode driver in a display apparatus according to a modification example of the first embodiment.

FIG. 16 is a diagram illustrating a configuration of a gate driver and a driving electrode driver in a display apparatus in a modified example of the first embodiment.

Each of switching elements SW1 and SW2 is not limited to the one formed of a CMOS, that is, two field effect transistors as described with reference to FIG. 9. Therefore, each of the switching elements SW1 and SW2 may be formed of, for example, four field effect transistors as described with reference to FIGS. 13 and 14.

That is, in the present modified example, as illustrated in FIG. 16, each of a plurality of switching elements SW1 includes a transistor group Trg1 formed of, for example, a p-channel transistor Tr111 (see FIG. 13) and an n-channel transistor Tr112 (see FIG. 13) that are connected in parallel with each other. And, each of the plurality of switching elements SW1 includes a transistor group Trg2 formed of, for example, a p-channel transistor Tr121 (see FIG. 14) and an n-channel transistor Tr122 (see FIG. 14) that are connected in parallel with each other.

Each of a gate electrode of the transistor TR111 and a gate electrode of the transistor Tr122 is connected to a terminal TN1 serving as a feeding unit that feeds an alternate-current signal Cout. Each of a gate electrode of the transistor Tr112 and a gate electrode of the transistor Tr121 is connected to a terminal TN2 serving as a feeding unit that feeds an alternate-current signal XCout.

In the present modified example, a connection wiring WRCout electrically connected to the terminal TN1 and extending along a power supply wiring PSL2 is provided in a partial region of a frame region FLA2, the partial region being a region FLA23 serving as a region between a region FLA21 and a region FLA22. And, a connection wiring WRXCout electrically connected to the terminal TN2 and extending along the power supply wiring PSL2 is provided in the region FLA23. Therefore, in the present modified example, the width of the frame region FLA2 in the X-axis direction is increased by the region AR4 where the connection wirings WRCout and WRXCout are provided, more than that in the first embodiment.

However, also in the present modified example, as similar to the first embodiment, a pitch PL12 serving as an average value of the distance in the Y-axis direction between the respective centers of ends EP1 adjacent to each other in an arrangement of m1×n1 ends EP1 is narrower than a pitch PL11 between the scanning signal lines GL1, and a pitch PL22 serving as an average value of the distance in the Y-axis direction between the respective centers of ends EP2 adjacent to each other in an arrangement of m2×n2 ends EP2 is narrower than a pitch PL21 between the scanning signal lines GL2.

Thus, a partial circuit CP2 formed of n2 transfer circuits VSR2 can be spaced apart from a partial circuit CP1 formed of n1 transfer circuits VSR1. Therefore, a circuit different from the partial circuits CP1 and CP2 can be arranged between the partial circuit CP1 and the partial circuit CP2, so that the area of the frame region FLA2 can be decreased.

Second Embodiment

In the first embodiment, the circuit for touch detection is inserted and arranged in the middle of the arrangement of the transfer circuits VSR. On the other hand, in a second embodiment, a circuit for display is inserted and arranged in the middle of the arrangement of transfer circuits VSR.

Also in the second embodiment, a configuration and an equivalent circuit of a display apparatus are similar to those in the first embodiment, and hence description thereof is omitted.

However, the display apparatus according to the second embodiment may not include a touch panel serving as an input device. Therefore, a configuration of a gate driver in the display apparatus not having the touch detection function and being provided with not a plurality of but one driving electrode COML will be described below as an example.

<Configuration of Gate Driver>

Figure 17:
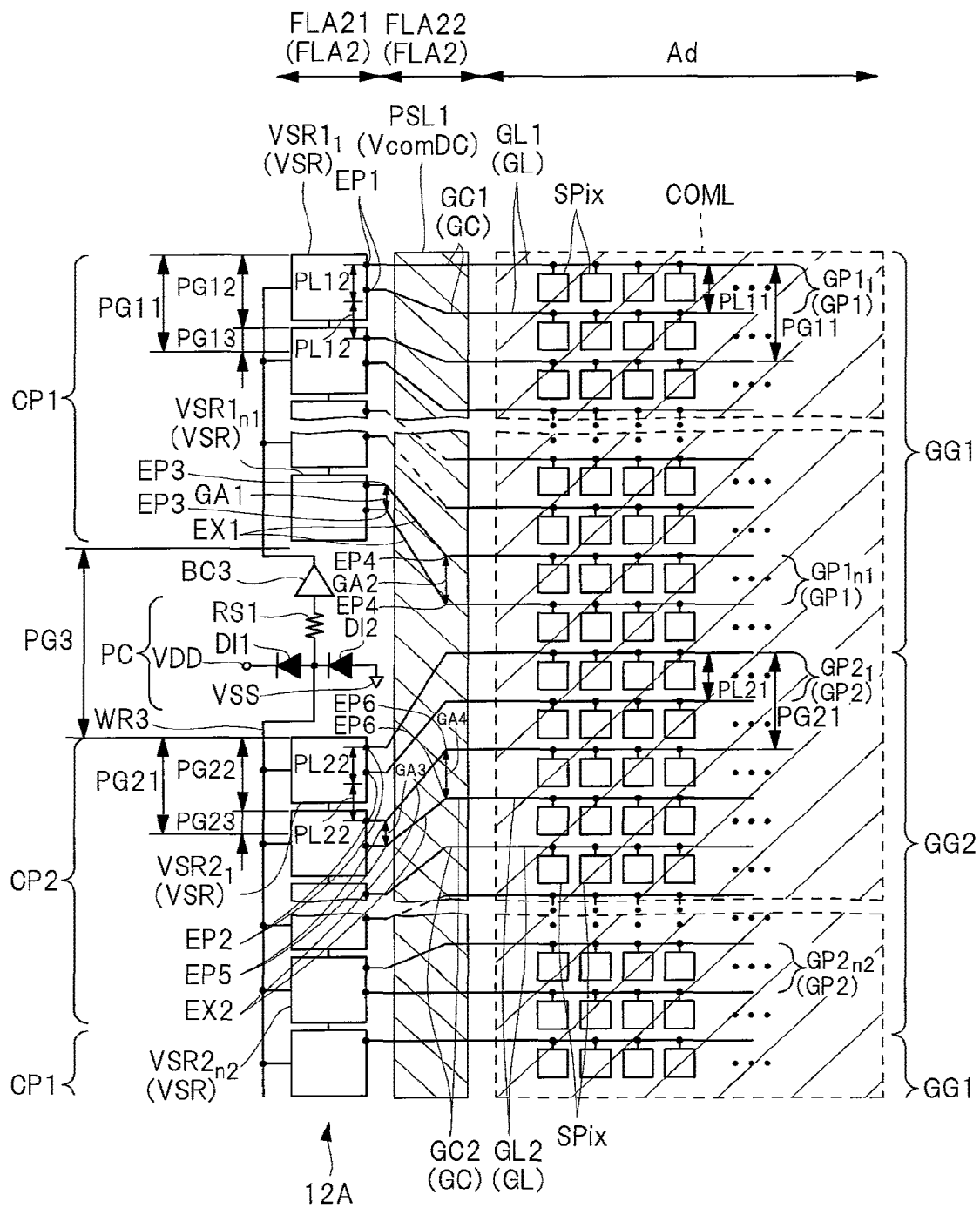
FIG. 17 is a diagram illustrating a configuration of gate drivers in a display apparatus according to the second embodiment.

Next, with reference to FIG. 17, a configuration of the gate drivers will be described. FIG. 17 is a diagram illustrating a configuration of the gate drivers in the display apparatus according to the second embodiment. Note that FIG. 17 illustrates a configuration of gate drivers 12A, and a configuration of gate drivers 12B (see FIG. 4) is similar thereto except that the gate drivers are provided to be symmetric with each other across an axis parallel to a Y-axis direction.

Hereinafter, a difference of the gate driver from that in the first embodiment will be mainly described. In the present second embodiment, note that the power supply wiring PSL is provided but the driving circuit VT, the power supply wiring PSL2, and the switching unit SWP (see FIG. 9) are not provided as different from the first embodiment.

In an example illustrated in FIG. 17, an extension portion EX1 overlaps a power supply wiring PSL1 when seen in a plan view, and an extension portion EX2 overlaps the power supply wiring PSL1 when seen in a plan view. In other words, in a region where the power supply wiring PSL1 is provided, the m1×n1 scanning signal connection wirings GC1 fan out so that a distance in the Y-axis direction between the scanning signal connection wirings GC1 adjacent to each other becomes larger as being closer to the positive side in an X-axis direction. And, in the region where the power supply wiring PSL1 is provided, the m2×n2 scanning signal connection wirings GC2 fan out so that a distance in the Y-axis direction between the scanning signal connection wirings GC2 adjacent to each other becomes larger as being closer to the positive side in the X-axis direction.

In the example illustrated in FIG. 17, the gate driver 12A includes a buffer circuit BC3 and a protection circuit PC in addition to partial circuits CP1 and CP2. The buffer circuit BC3 and the protection circuit PC are arranged between the partial circuit CP1 and the partial circuit CP2 instead of the driving circuit VT in the first embodiment, and are electrically connected to both the partial circuits CP1 and CP2.

A signal such as a clock signal to be fed to the partial circuit CP1 is input to the buffer circuit BC3, and the input signal is buffered and fed to the partial circuit CP1. Alternatively, a signal to be fed to the partial circuit CP2 may be input, and the input signal may be buffered and fed to the partial circuit CP2.

The protection circuit PC may protect the partial circuit CP1 or CP2 from static electricity. That is, the protection circuit PC may protect the partial circuit CP1 or CP2 from electrostatic discharge (ESD) caused by the static electricity.

The protection circuit includes, for example, a resistive element RS1 and diodes DI1 and DI2. The resistive element RS1 is provided in the middle of a connection wiring WR3 for connecting the partial circuit CP1 and the partial circuit CP2. The diode DI1 is connected between a power supply potential VDD and the connection wiring WR3 so that a reverse bias is applied thereto during a normal state, and the diode DI2 is connected between the connection wiring WR3 and a ground potential VSS so that a reverse bias is applied thereto during a normal state.

In the example illustrated in FIG. 17, note that the buffer circuit BC3 and the protection circuit PC are connected in series with each other between the partial circuit CP1 and the partial circuit CP2. However, only either the buffer circuit BC3 or the protection circuit PC may be connected between the partial circuit CP1 and the partial circuit CP2.

For example, to the partial circuit CP1, a signal such as a clock signal or a reset signal to be fed to a shift register SRC (see FIG. 10) included in the plurality of transfer circuits VSR in the partial circuit CP1 is fed.

By the increase in the size of the display apparatus, a wiring resistance, i.e., a wiring load in the gate driver 12A including the partial circuits CP1 and CP2 is increased. By this increase, in the transfer circuit VSR arranged at a position far from a frame region FLA1 (see FIG. 4), a waveform of a signal such as a clock signal or a rest signal to be fed to the transfer circuit VSR is more deteriorated than that in the transfer circuit VSR arranged at a position closer to the frame region FLA1 than the transfer circuit VSR, resulting in a defect in the fed signal.

Therefore, when the buffer circuit BC3 is provided, the defect can be prevented or suppressed from occurring in the signal to be fed to the transfer circuit VSR arranged at the position far from the frame region FLA1.

By the increase in the size of the display apparatus, the length of the wiring in the gate driver 12A including the partial circuits CP1 and CP2 is increased. By this increase, an element provided in the gate driver 12A including the partial circuits CP1 and CP2 is easily broken by static electricity, and, for example, a manufacturing yield of the display apparatus is decreased.

Therefore, when the protection circuit PC is provided, the element provided in the gate driver 12A including the partial circuits CP1 and CP2 is not easily broken by static electricity, and, for example, the manufacturing yield of the display apparatus is increased.

Preferably, the number of scanning signal lines GL1 connected to one transfer circuit VSR1 included in the partial circuit CP1 and the number of scanning signal lines GL2 connected to one transfer circuit VSR2 included in the partial circuit CP2 are equal to each other, and the number of transfer circuit VSR1 included in the partial circuit CP1 and the number of transfer circuits VSR2 included in the partial circuit CP2 are equal to each other. That is, the buffer circuit BC3 or the protection circuit PC is inserted and arranged at the center of an arrangement of the 2×n1 transfer circuits VSR formed of the n1 transfer circuits VSR1 included in the partial circuit CP1 and the n2, in other words, n1 transfer circuits VSR2 included in the partial circuit CP2. In other words, a driving circuit VT serving as a circuit for display is inserted and arranged in the middle of the arrangement of the transfer circuits VSR.

Thus, a maximum value of an angle between the X-axis direction and a direction in which the extension portion EX1 extends in a direction inclined from the X-axis direction can be decreased, and the scanning signal connection wirings GC1 can be easily arranged. A maximum value of an angle between the X-axis direction and a direction in which the extension portion EX2 extends in a direction inclined from the X-axis direction can be decreased, and the scanning signal connection wirings GC2 can be easily arranged.

<Width in Transverse Direction of Frame Region>

Also in the present second embodiment, a pitch PL12 serving as an average value of the distance in the Y-axis direction between the respective centers of ends EP1 adjacent to each other in the arrangement of m1×n1 ends EP1 is narrower than the pitch PL1 between the scanning signal lines GL1 as similar to the first embodiment. And, a pitch PL22 serving as an average value of the distance in the Y-axis direction between the respective centers of ends EP2 adjacent to each other in the arrangement of m2×n2 ends EP2 is narrower than the pitch PL21 between the scanning signal lines GL2.

Thus, the partial circuit CP2 formed of the n2 transfer circuits VSR2 can be spaced apart from the partial circuit CP1 formed of the n1 transfer circuit VSR1. Therefore, a circuit different from the partial circuits CP1 and CP2 can be arranged between the partial circuit CP1 and the partial circuit CP2, so that the area of the frame region FLA2 can be decreased.

On the other hand, in the present second embodiment, a circuit for display is inserted and arranged in the middle of the arrangement of the transfer circuits VSR, instead of the circuit for touch detection. Even when such a circuit for display is inserted and arranged, a circuit different from the partial circuits CP1 and CP2 can be arranged between the partial circuit CP1 and the partial circuit CP2 as similar to the case in which the circuit for touch detection is inserted and arranged, so that the area of the frame region FLA2 can be decreased.

In the foregoing, the invention made by the present inventors has been concretely described based on the embodiments. However, it is needless to say that the present invention is not limited to the foregoing embodiments and various modifications and alterations can be made within the scope of the present invention.

In the present embodiments, the case of the liquid crystal display has been exemplified as a disclosure example. However, as other application examples, any flat panel display apparatus can be cited, such as an organic EL display apparatus, other self-luminous display apparatuses, and an electronic paper display apparatus having an electrophoresis element. It is needless to say that the present invention is applicable to display apparatuses of a small to medium size to a large size without being particularly limited thereto.

In the scope of the idea of the present invention, various modified examples and alteration examples could have been easily thought up by those who skilled in the art, and it would be understood that these various modified examples and alteration examples belong to the scope of the present invention.

For example, the ones obtained by appropriate addition, removal, or design-change of the components to/from/into each of the above-described embodiments by those who skilled in the art or by addition, omitting, or condition-change of the step to/from/into each of the above-described embodiments are also within the scope of the present invention as long as they include the concept of the present invention.

The present invention is effectively applied to a display device.

What is claimed is:

1. A display apparatus comprising:
 a substrate having a display region and a peripheral region;
 a first pixel and a second pixel in the display region;
 a first scanning line connected to the first pixel, and a second scanning line connected to the second pixel and being next to the first scanning line;
 a peripheral circuit in the peripheral region; and
 a first connection wiring connecting the peripheral circuit and the first scanning line in the peripheral region, and a second connection wiring connecting the peripheral circuit and the second scanning line in the peripheral region,
 wherein the first and the second scanning lines extend in a first direction, and peripheral circuit extends in a second direction intersecting the first direction in a plan view,
 wherein the first scanning line and the second scanning line are arranged with a first pitch,
 wherein the first connection wiring connects to the peripheral circuit at a first end, and the second connection wiring connects to the peripheral circuit at a second end, and
 wherein a second pitch in the second direction between the first end and the second end is smaller than the first pitch.

2. The display apparatus according to claim 1, further comprising
 a third pixel and a fourth pixel in the display region;
 a third scanning line connected to the third pixel, and a fourth scanning line connected to the fourth pixel and being next to the third scanning line; and
 a third connection wiring connecting the peripheral circuit and the third scanning line in the peripheral region, and a fourth connection wiring connecting the peripheral circuit and the fourth scanning line in the peripheral region,
 wherein the third scanning line and the fourth scanning line are arranged with the first pitch,
 wherein the third connection wiring connects to the peripheral circuit at a third end, and the fourth connection wiring connects to the peripheral circuit at a fourth end, and
 wherein a third pitch in the second direction between the third end and the fourth end is smaller than the first pitch.

3. The display apparatus according to claim 2,
 wherein the third scanning line is next to the second scanning line, and
 wherein the third end is disposed between the second end and the fourth end, and a fourth pitch in the second direction between the second end and the fourth end is larger than the first pitch.

4. The display apparatus according to claim 1, further comprising
 a first pixel electrode in the first pixel and a second pixel electrode in the second pixel, and a driving electrode overlaps the first pixel electrode and the second pixel electrode,
 wherein the driving electrode is connected to a driving circuit.

5. The display apparatus according to claim 3, further comprising
 a third pixel electrode in the third pixel and a fourth pixel electrode in the fourth pixel, and the driving electrode overlaps the third pixel electrode and the fourth pixel electrode,
 wherein the driving electrode is connected to a driving circuit, and the driving circuit is disposed between the second end and the third end.

6. The display apparatus according to claim 3,
 wherein the peripheral circuit includes a first part connected to the first connection wiring and the second connection wiring, and a second part connected to the third connection wiring and the fourth connection wiring.

7. The display apparatus according to claim 6, further comprising
 a third pixel electrode in the third pixel and a fourth pixel electrode in the fourth pixel, and the driving electrode overlaps the third pixel electrode and the fourth pixel electrode,
 wherein the driving electrode is connected to a driving circuit, and the driving circuit is disposed between the first part and the second part.

* * * * *